United States Patent
Ide et al.

(10) Patent No.: US 9,870,974 B2
(45) Date of Patent: Jan. 16, 2018

(54) POWER CONVERSION APPARATUS INCLUDING WEDGE INSERTS

(71) Applicant: Hitachi, Ltd., Chiyoda-ku, Tokyo (JP)

(72) Inventors: Eiichi Ide, Tokyo (JP); Hiroshi Shintani, Tokyo (JP); Hisashi Tanie, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/123,355

(22) PCT Filed: Mar. 28, 2014

(86) PCT No.: PCT/JP2014/059071
§ 371 (c)(1),
(2) Date: Sep. 2, 2016

(87) PCT Pub. No.: WO2015/145711
PCT Pub. Date: Oct. 1, 2015

(65) Prior Publication Data
US 2017/0069562 A1 Mar. 9, 2017

(51) Int. Cl.
*H01L 23/34* (2006.01)
*H01L 23/373* (2006.01)
(Continued)

(52) U.S. Cl.
CPC ........ *H01L 23/3736* (2013.01); *H01L 23/051* (2013.01); *H01L 23/367* (2013.01);
(Continued)

(58) Field of Classification Search
CPC .............. H01L 23/3736; H01L 23/367; H01L 23/3672; H01L 23/3735; H01L 23/051;
(Continued)

(56) References Cited

U.S. PATENT DOCUMENTS

| 6,538,308 | B1 | 3/2003 | Nakase et al. |
| 2003/0075784 | A1* | 4/2003 | Nakase .................. H01L 23/42 257/675 |
| 2007/0096278 | A1* | 5/2007 | Nakatsu ............. H01L 23/3675 257/678 |

FOREIGN PATENT DOCUMENTS

| JP | 5-166963 A | 7/1993 |
| JP | 2000-91485 A | 3/2000 |

(Continued)

OTHER PUBLICATIONS

International Search Report (PCT/ISA/210) issued in PCT Application No. PCT/JP2014/059071 dated Jul. 1, 2014 with English translation (5 pages).

*Primary Examiner* — Matthew Gordon
(74) *Attorney, Agent, or Firm* — Crowell & Moring LLP

(57) ABSTRACT

A power conversion apparatus includes: a circuit body including a switching device; a base member forming a first concave portion and a cooling surface; and a wedge inserted in the first concave portion of the base member. The first concave portion of the base member is formed by a substrate portion forming the cooling surface, a first wall disposed on the opposite side of the substrate portion from the cooling surface, and an intermediate portion interconnecting the first wall and the substrate portion. The first wall forms an insertion space for insertion of the wedge, and a heat transfer plane forming a heat dissipating surface and a heat transfer path of the circuit body. The intermediate portion is plastically deformed by inserting the wedge into the insertion space, thus causing the first wall to be displaced toward the location of the circuit body.

11 Claims, 38 Drawing Sheets

(51) Int. Cl.
  *H01L 23/00*     (2006.01)
  *H01L 23/367*    (2006.01)
  *H01L 23/40*     (2006.01)
  *H01L 25/00*     (2006.01)
  *H01L 23/051*    (2006.01)
  *H01L 23/528*    (2006.01)
  *H01L 23/467*    (2006.01)
  *H01L 23/473*    (2006.01)

(52) U.S. Cl.
  CPC ...... *H01L 23/3672* (2013.01); *H01L 23/3735* (2013.01); *H01L 23/40* (2013.01); *H01L 23/528* (2013.01); *H01L 23/562* (2013.01); *H01L 24/33* (2013.01); *H01L 25/00* (2013.01); *H01L 23/467* (2013.01); *H01L 23/473* (2013.01); *H01L 2924/13055* (2013.01)

(58) Field of Classification Search
  CPC ..... H01L 23/40; H01L 23/528; H01L 23/562; H01L 24/33; H01L 25/00
  See application file for complete search history.

(56) References Cited

FOREIGN PATENT DOCUMENTS

| | | |
|---|---|---|
| JP | 2006-107887 A | 4/2006 |
| JP | 2007-53295 A | 3/2007 |
| JP | 2012-248700 A | 12/2012 |

\* cited by examiner

POWER CONVERSION APPARATUS INCLUDING WEDGE INSERTS

TECHNICAL FIELD

The present invention relates to a power conversion apparatus and more particularly, to a power conversion apparatus for use in automobiles, railway equipment, industrial equipment, electric power equipment and the like.

BACKGROUND ART

Recently, a highly efficient power conversion apparatus utilizing the switching of a semiconductor device called power semiconductor chip for energy-saving purposes has been used in a wide variety of fields such as automobiles, railway equipment, industrial equipment and electric power equipment. Having a high heat value associated with energization, the power semiconductor chip used in this way needs cooling and is faced with demand for downsizing.

In a case where there are plural power semiconductor modules each equipped with a power semiconductor device and where each module is electrically connected with other components constituting a heat-dissipating body and a converter, the structure of the power conversion apparatus is complicated and enlarged in order to maintain cooling performance, electric performance and insulation performance.

A structure set forth in Patent Literature 1, for example, is cited as a prior art related to the invention.

A power conversion apparatus disclosed in Patent Literature 1 has a structure where plural circuit bodies carrying power semiconductor chips are mounted on a single heat-dissipating body. When the power semiconductor chips are mounted on the heat-dissipating body, stress is generated by using screws while a member for converting the stress to plane pressure and a member for eliminating clearance between the heat-dissipating body and the circuit body carrying the semiconductor devices are employed.

CITATION LIST

Patent Literature

Patent Literature 1: Japanese Patent Application Laid-Open No. 2000-091485

SUMMARY OF INVENTION

Technical Problem

The above-described structure of Patent Literature 1 requires a large number of parts of different functions such as the heat-dissipating body, the member for transferring heat from the power semiconductor chips to the heat-dissipating body, and the member for converting the screw-generated stress to the plane pressure. This results in the increase of the volume for parts installation, making it difficult to downsize the power conversion apparatus. Further, the structure also suffers difficulty in improving assemblability.

In view of the above problems, the invention has an object to reduce the volume increase of the pressing members such as screws and springs for mounting the circuit body with the power semiconductor chip on the heat-dissipating body and to accomplish the downsizing of the power conversion apparatus.

Another object of the invention is to improve the assemblability of the power conversion apparatus.

Solution to Problem

According to an aspect of the invention for achieving the above objects, a power conversion apparatus includes: a circuit body including a switching device; a base member forming a first concave portion and a cooling surface; and a wedge inserted in the first concave portion of the base member, and has a structure wherein the first concave portion of the base member is formed by: a substrate portion forming the cooling surface; a first wall disposed on the opposite side of the substrate portion from the cooling surface; and an intermediate portion interconnecting the first wall and the substrate portion, wherein the first wall forms an insertion space for insertion of the wedge, and a heat transfer plane forming a heat dissipating surface and a heat transfer path of the circuit body, and wherein the intermediate portion is plastically deformed by inserting the wedge into the insertion space, thus causing the first wall to be displaced toward the location of the circuit body.

Advantageous Effects of Invention

The invention provides for the downsizing of the power conversion apparatus. The invention is also adapted to enhance the assemblability of the power conversion apparatus.

DESCRIPTION OF EMBODIMENTS

Figure 1:
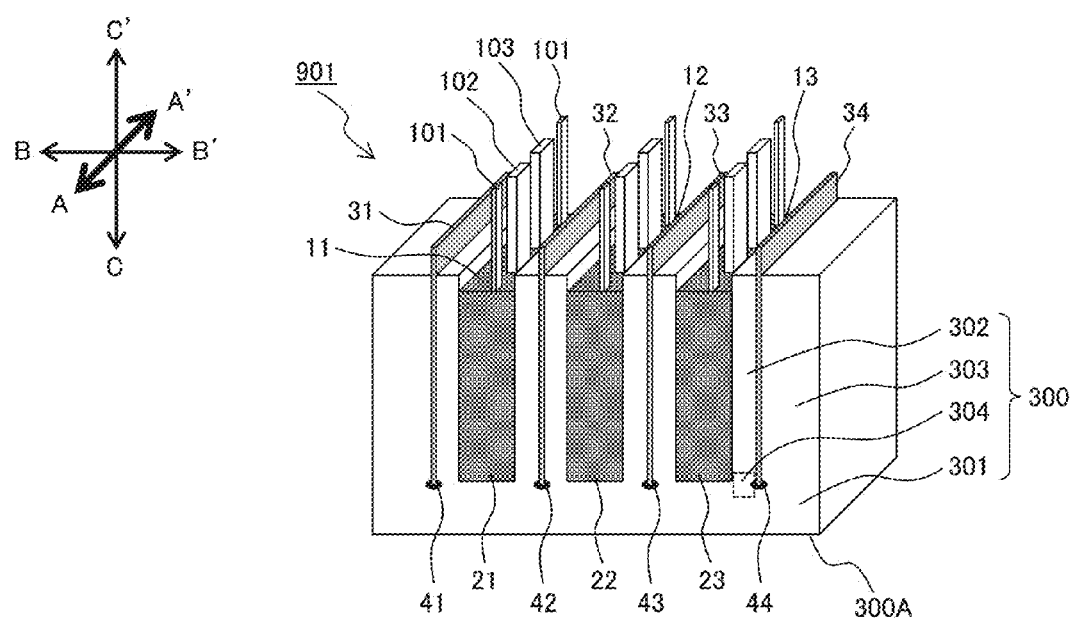
FIG. 1 is a perspective view of an example of a power conversion apparatus 901 according to an embodiment of the invention.

FIG. 1 is a perspective view of an example of a power conversion apparatus 901 according to an embodiment of the invention.

An object of the embodiment is to downsize the power conversion apparatus 901 by fixing a circuit body by applying plane pressure with wedges.

A plurality of circuit bodies 11 to 13 and wedges 31 to 34 are arranged in a BB' direction. A substrate portion 301 defines a cooling surface 300A on a lower side thereof, namely on a C side in a CC' direction. The circuit body 11 to 13 includes a control terminal 101 for transmitting a control signal, and power terminals 102 and 103 for transferring a direct current or alternating current. The control terminal 101 and power terminals 102 and 103 project from an opposite side from the side where the substrate portion 301 is disposed, namely from a C' side.

The circuit bodies 11 to 13 each include: a power semiconductor device 100 such as IGBT or diode, which will be described hereinafter with reference to FIG. 4; a wiring layer 104A electrically connected to a collector electrode of the power semiconductor device 100; and a wiring layer 104B electrically connected to an emitter electrode of the power semiconductor device 100. Further, the circuit bodies 11 to 13 each include a sealing resin 107 (see FIG. 3) for sealing the power semiconductor device 100, wiring layer 104A and wiring layer 104B. Furthermore, the circuit bodies 11 to 13 each include heat dissipating surfaces 106 (see FIG. 3) formed on the opposite sides thereof in the BB' direction and parallel to a plane defined by lines extended in an AA' direction and the CC' direction.

A base member 300 forms: first concave portions 21 to 23 each allowing the insertion of the circuit body 11 to 13 and accommodating the circuit body 11 to 13; and second concave portions 41 to 44 each allowing the insertion of the wedge 31 to 34 and accommodating the wedge 31 to 34. The first concave portions 21 to 23 and second concave portions 41 to 44 are extended in the AA' direction and arranged in the BB' direction.

First walls 302 of the base member 300 are disposed in spaces between respective pairs of circuit bodies 11 to 13 and on a lateral side of the circuit body 11 and a lateral side of the circuit body 13, so as receive heat from the circuit bodies 11 to 13. The substrate portion 301 of the base member 300 collects the heat from the circuit bodies 11 to 13 via the first walls 302.

The second concave portion 41 to 44 is so formed as to be enlarged in size in the BB' direction at a bottom thereof or its portion on the substrate portion 301 side. An intermediate portion 304 of the base member 300 is defined by a portion that is made smaller than the dimension of the first wall 302 in the BB' direction because of the enlarged bottom of the second concave portion 41 to 44.

A second wall 303 forms a side wall of the base member 300. The base member 300 includes the substrate portion 301, the first walls 302, the intermediate portions 304 and the second walls 303 which are molded in one piece.

In order to eliminate clearances between the first walls 302 and the circuit bodies 11 to 13, the wedges 31 to 34 are fixed in the base member 300 so as to generate a compressive force parallel to the BB' direction.

Thus is generated a compressive force on the overall heat dissipating surfaces 106 provided at the circuit bodies 11 to 13 so that the heat dissipating surfaces can be reduced in interfacial thermal resistance with the first walls 302. The wedges 31 to 34 are inserted in the CC' direction.

The wedges 31 to 34 and the second concave portions 41 to 44 are extended in the wedge insertion direction (CC' direction) and have the same inclination angle to the substrate portion 301. This configuration is adapted to eliminate the clearances between the first walls 302 and the circuit bodies 11 to 13 and to increase the compressive force on the circuit bodies 11 to 13 in conjunction with the increase of the insertion amount of the wedges.

Figure 2:
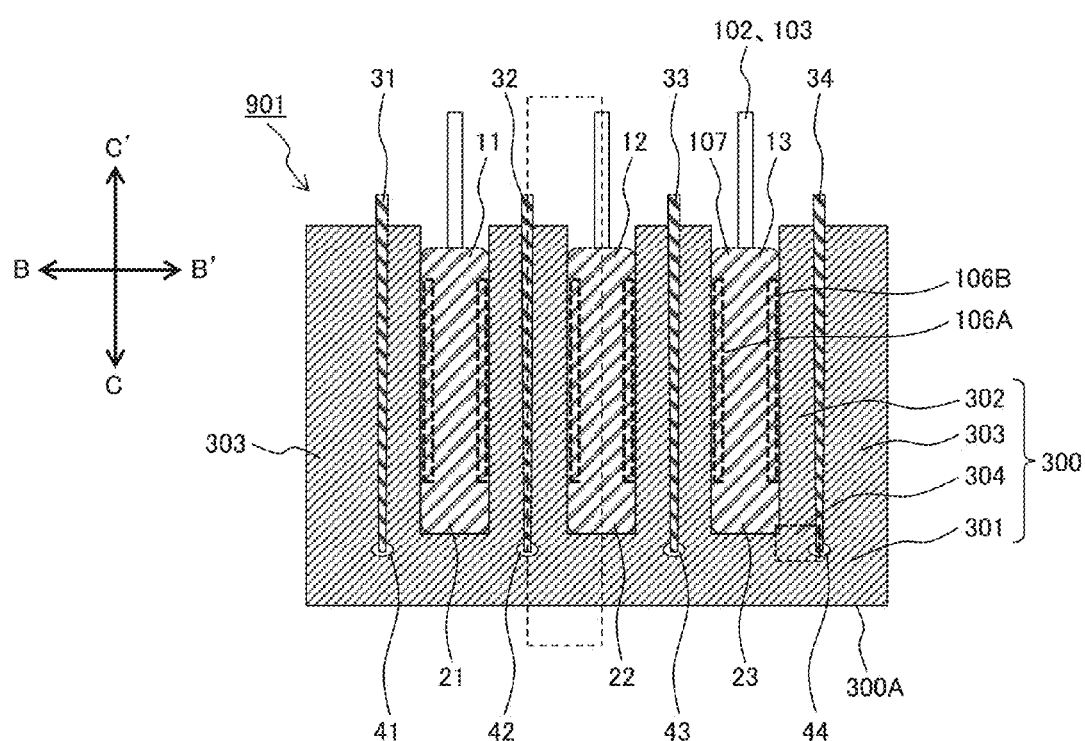
FIG. 2 is a sectional view of a BB'/CC' cross section of the apparatus of FIG. 1 as seen in the AA' direction.

FIG. 2 is a sectional view of a BB'/CC' cross section of the apparatus of FIG. 1 as seen in the AA' direction.

To allow for the insertion of the circuit bodies 11 to 13, the first concave portions 21 to 33 are made slightly larger than the circuit bodies 11 to 13 in the BB' direction so that clearances are formed between the first concave portions and the circuit bodies 11 to 13.

The second concave portions 41 to 44 are extended in the wedge insertion direction (CC' direction) and have the same inclination angle to the substrate portion 301 with respect to the BB' direction. This configuration is adapted to uniformize the deformation of the first walls 302 in the BB' direction, which deformation is caused by the wedge insertion, and to uniformize the plane pressure on the circuit bodies 11 to 13 in a compression direction.

The first wall 302 is formed such that a side facing the circuit body 11 to 13 is parallel to the heat dissipating surface 106 of the circuit body 11 to 13. Meanwhile, the first wall 302 is formed such that a side contacting the wedge 31 to 34 has the same inclination angle as the wedge 31 to 34. A root of the first wall 302 includes the intermediate portion 304 which is formed by increasing the width of the second concave portion 41 to 44. The first wall 302 is integrated with the substrate portion 301.

The intermediate portions 304, the details of which will be described hereinafter, are so configured as to be prone to plastic deformation upon insertion of the wedges 31 to 34. The intermediate portions are configured the same way in the AA' direction so that the first walls 302 are uniformly deformed. Hence, the plane pressure on the circuit bodies 11 to 13 is uniformized.

When the wedge 31 to 34 is squeezed in, the existence of the intermediate portions 304 permits a small press force to apply an even plane pressure to the heat dissipating surfaces 106 of the circuit body 11 to 13 in the compression direction. This prevents the cooling surface 300A of the substrate portion 301 from suffering warpage or undulation. Hence, the power conversion apparatus can be mounted to a cooling device without increasing thermal resistance. Further, creep effects can be reduced because the load of squeezing in the wedges 31 to 34 can be reduced.

The substrate portion 301 is increased in rigidity by having a greater thickness than those of the first walls 302 and the intermediate portions 304 in order not to suffer undulations or warpage on the cooling surface even though the first wall 302 is deformed. Further, the substrate portion 301 is effective to reduce the temperature increase of the power semiconductor devices 100 by collecting the heat from the circuit bodies 11 to 13. Because of being undeformable, the substrate portion prevents the circuit bodies 11 to 13 from deviation of positional relation therebetween.

Such a configuration not only facilitates the electrical connection of the control terminal 101 and the electrical connection between the power terminal 102 and the power terminal 103, but also negates the need for providing a large space to ensure insulation distance. This provides for the downsizing of the power conversion apparatus or an electric power converter.

Similarly to the substrate member 301, the second walls 303 defining the side walls have a greater thickness than the first walls 302 so as to be increased in rigidity and less deformable. The existence of the substrate portion 301 in combination with the second walls 303 provides reference planes with respect to any directions. Based on such reference planes, alignment with other components such as a cooling device and capacitor can be easily accomplished during a manufacturing process of the power conversion apparatus or in the subsequent process of mounting the apparatus to the electric power converter. Thus, the productivity is increased.

Figure 3:
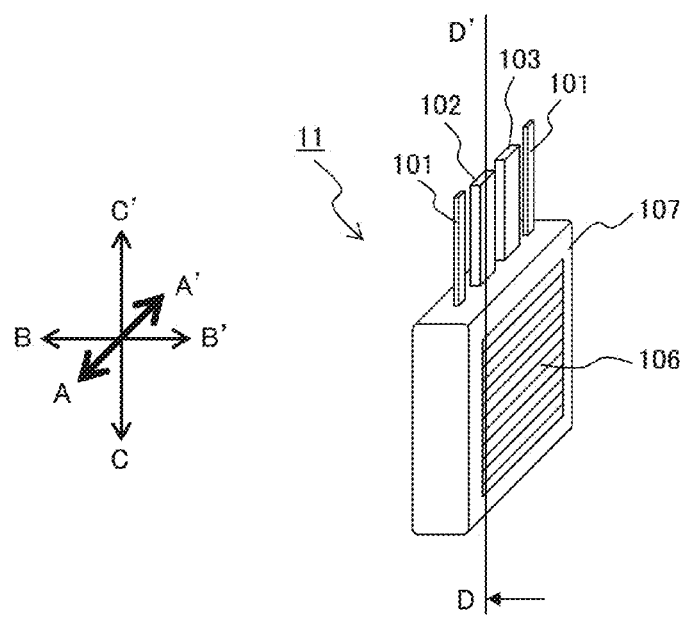
FIG. 3 is a perspective view of a circuit body 11.

FIG. 3 is a perspective view of the circuit body 11. FIG. 4 is a sectional view of a cross section taken on the line DD' in FIG. 3. Since the circuit bodies 11 to 13 have the same configuration, the description is made on the circuit body 11 as a representative example.

Figure 4:
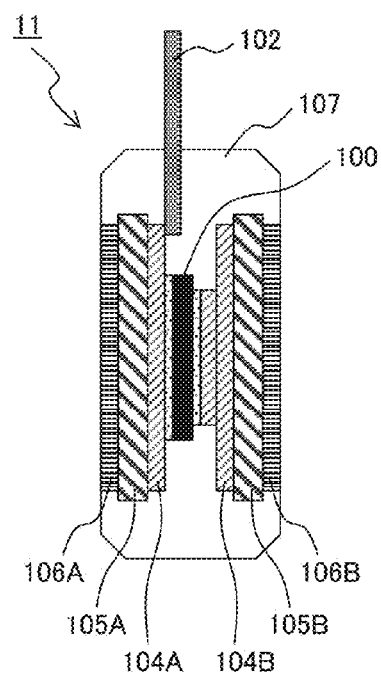
FIG. 4 is a sectional view of a cross section taken on the line DD' in FIG. 3.

As shown in FIG. 4, the circuit body 11 includes: the power semiconductor device 100 such as IGBT and diode; the wiring layer 104A electrically connected to the collector electrode of the power semiconductor device 100; and the wiring layer 104B electrically connected to the emitter electrode of the power semiconductor device 100.

The circuit body 11 further includes the sealing resin 107 (see FIG. 3) for sealing the power semiconductor device 100, wiring layer 104A and wiring layer 104B. Furthermore, the circuit body 11 includes the heat dissipating surfaces 106 (see FIG. 3) formed on the opposite sides thereof in the BB' direction and parallel to a plane defined by lines extended in the AA' direction and CC' direction.

The circuit body 11 includes the heat dissipating surfaces 106 on the opposite sides thereof perpendicular to the BB' direction. The power semiconductor device 100 includes main electrodes on the opposite sides thereof. A heat dissipating surface 106A is disposed in parallel to the collector electrode of the power semiconductor device 100. A heat dissipating surface 106B is disposed in parallel to the emitter electrode of the power semiconductor device 100.

The wiring layer 104A and the wiring layer 104B are electrically connected to the collector-side electrode surface and the emitter-side electrode surface of the IGBT as opposed to the electrode surfaces in parallel, respectively. The circuit body is configured to reduce inductance by cancelling out the magnetic fields.

The power terminal 102 is connected to the wiring layer 104A with a bonding material. This bonding material is based on a solder, silver oxide having a particle size of 50 µm or less (AgO, $Ag_2O$), or copper oxide (CuO) particles.

The wiring layer 104A is made of a metal having a low electric resistance such as copper (Cu), aluminum (Al) and alloys thereof. Thermal stress applied to the power semiconductor device 100 can be lowered by reducing the composite thermal expansion coefficient of the wiring layer 104A. To reduce the composite thermal expansion coefficient while maintaining surge withstand current and heat diffusibility of the wiring layer, a layer having high thermal conductivity and low thermal expansion is inserted between the wiring layer 104A and an insulation layer 105A. The above layer is composed of, for example, Cu, Al or an alloy thereof in which molybdenum, tungsten, carbon or the like is dispersed or which is complexed therewith.

The insulation layer 105A is made of a resin in which a sintered compact of a highly thermal conductive oxide or nitride such as alumina, aluminum nitride and silicon nitride, or a highly thermal conductive filler such as alumina, aluminum nitride and boron nitride is dispersed. Any of the resins is formed in a controlled thickness required for insulation.

The heat dissipating surface 106A is made of a highly thermal conductive metal such as copper, aluminum and alloys thereof, or a material having high thermal conductivity and low thermal expansion and composed of copper or aluminum in which molybdenum, tungsten or carbon is dispersed or which is complexed therewith. The heat dissipating surface exists on the outer side of the insulation layer 105A so as to protect the insulation layer 105A from mechanical damages.

The wiring layer 104B, an insulation layer 105B and the heat dissipating surface 106B have the same properties as the wiring layer 104A, an insulation layer 105A and the heat dissipating surface 106A.

The sealing resin 107 is transfer molded so as to form the circuit body 11 featuring parallel exposure planes (heat dissipation planes) of the heat dissipating surfaces 106AB and an even thickness. Since the control terminal 101, the collector-side power terminal 102 and the emitter-side power terminal 103 are subjected to mold clamping during the transfer molding, these terminals are also parallel to the heat dissipation planes and define a regular terminal-to-terminal positional relation.

The sealing resin 107 can employ adhesive resins based on phenolic resin, acrylic resin, polyimide resin, polyamide-imide resin, epoxy resin, silicone resin, bismaleimide triazine resin, or cyanate ester resin. Such a resin contains ceramics, gel or rubber of $SiO_2$, $Al_2O_3$, AlN or BN so as to control the thermal expansion coefficient for achieving a notable reduction of the thermal stress generated in the power semiconductor device 100 and the insulation layer 105.

The heat dissipating surface 106A and the heat dissipating surface 106B are so transfer molded as to be exposed from the sealing resin 107. If the heat dissipating surface 106A and the heat dissipating surface 106B are not exposed, they can be made exposed by grinding or the like. In this process, the thicknesses of these heat dissipating surfaces can be equalized by grinding using the control terminal 101, the power terminal 102 and the power terminal 103 as the reference planes. In this manner, the circuit body can maintain positioning quality. As illustrated by this embodiment, the heat dissipating surfaces 106A and 106B are disposed on the outer side of the insulation layer 105A and the insulation layer 105B, and the insulation layers are sealed with the sealing resin 107. Therefore, the circuit body can be prevented from being degraded in insulation quality by the grinding step.

Figure 5:
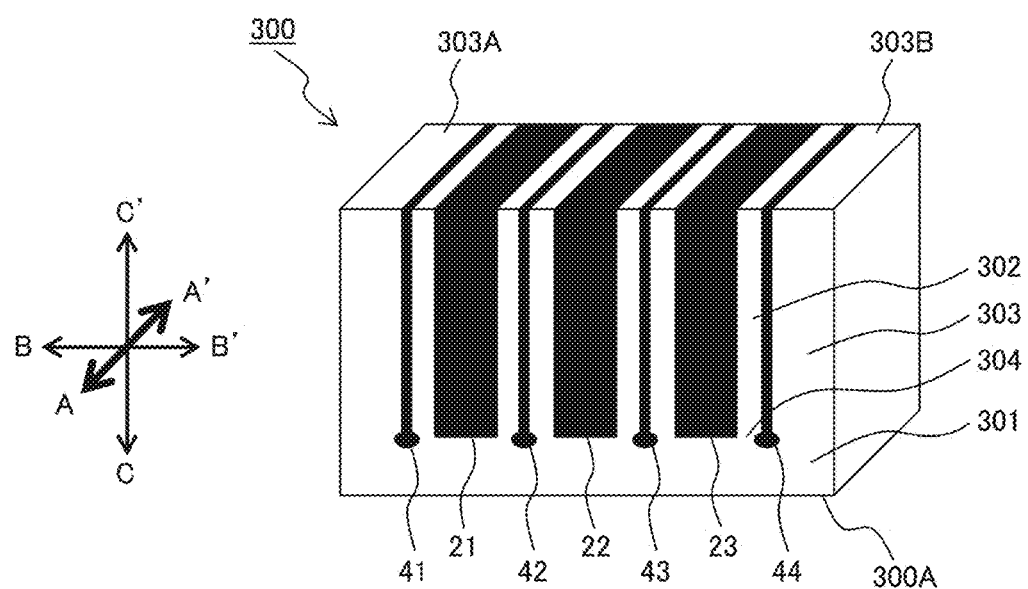
FIG. 5 is a perspective view of a base member 300.
Figure 6:
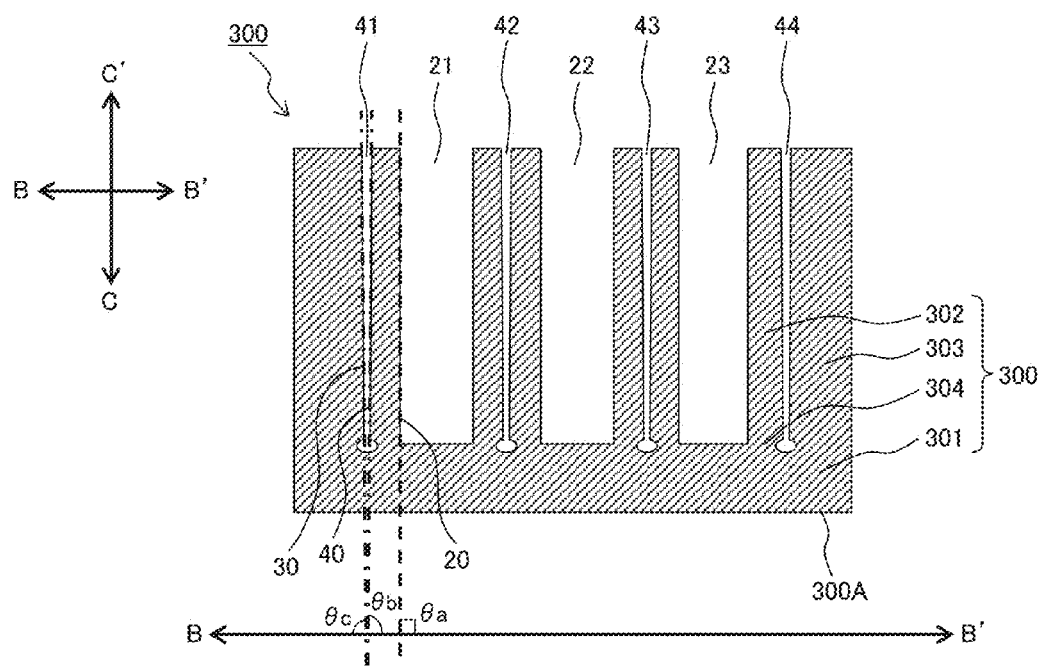
FIG. 6 is a sectional view of a BB'/CC' cross section of the base member 300.
Figure 7:
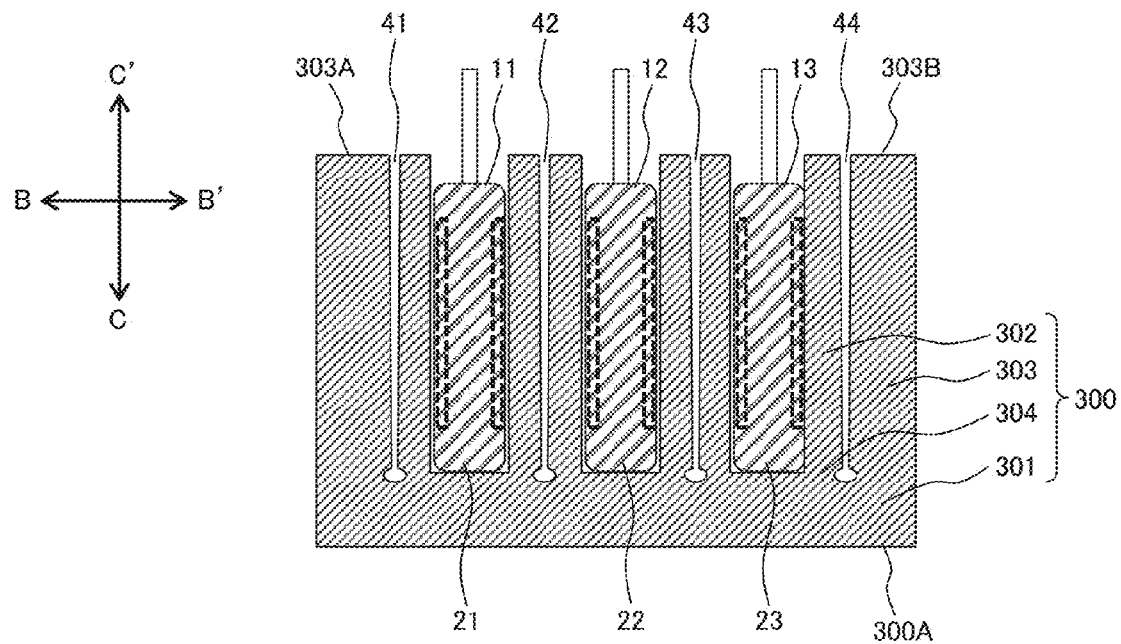
FIG. 7 is a diagram showing a step of inserting circuit bodies 11 to 13.
Figure 8:
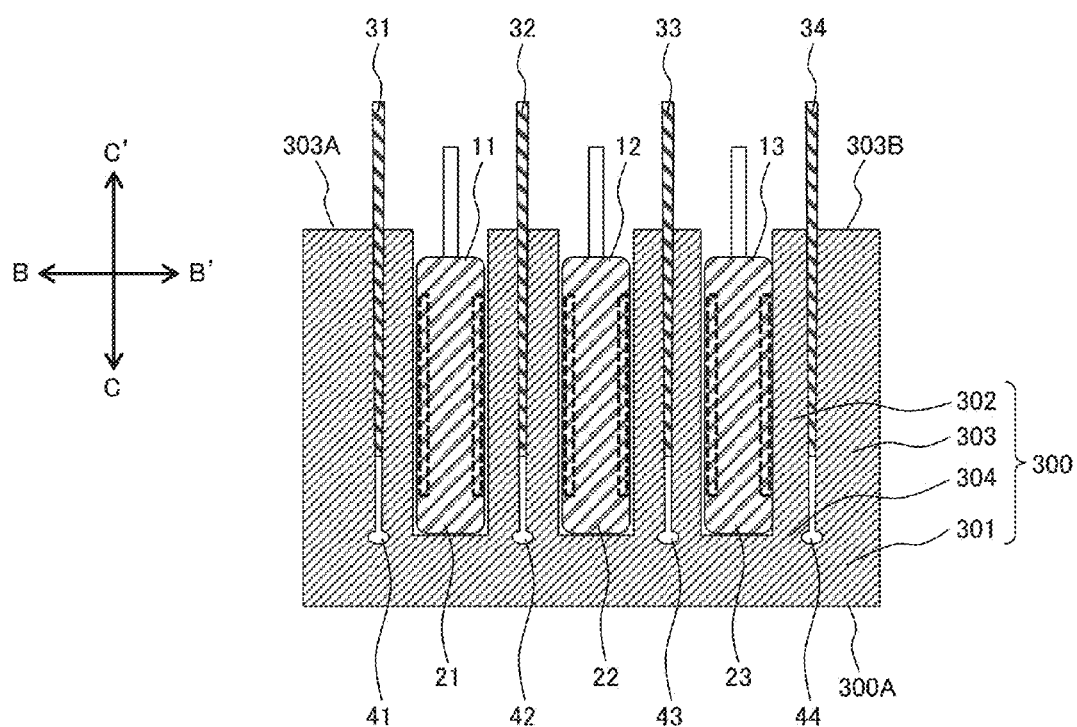
FIG. 8 is a diagram showing a step of inserting wedges 31 to 34.

The manufacturing process of the power conversion apparatus of the embodiment is described with reference to FIG. 5 to FIG. 8. FIG. 5 is a perspective view of the base member 300. FIG. 6 is a sectional view of a BB'/CC' cross section of the base member 300. FIG. 7 is a diagram showing a step of inserting the circuit bodies 11 to 13. FIG. 8 is a diagram showing a step of inserting the wedges 31 to 34.

The base member 300 is formed of a metal having high thermal conductivity such as Al, Cu and alloys thereof. The first walls 302 defining a heat transfer portion and the substrate portion 301 defining a heat collecting portion are monolithically formed without interface. Hence, the base member does not encounter the increase in thermal resistance associated with the existence of interface.

The base member 300 is formed by extrusion molding or pultrusion molding in the AA' direction so that the substrate portion 301 can be integrated with the first walls 302, the second walls 303, the first concave portions 21 to 23 and the second concave portions 41 to 44 with high precisions.

As shown in FIG. 6, the first concave portion 21 to 23 has a first wall surface 20 on the circuit body side 11 to 13 forming an angle $\theta_a$ of 900 so that the circuit body 11 to 13 is accommodated in the first concave portion as positioned perpendicular to the substrate portion 301 and in parallel to the second wall 303. The first concave portion 21 to 23 is open at AA' sides so as to allow access to the circuit body 11 to 13 inserted in the first concave portion 21 to 23.

This permits a simple jig to position the circuit body 11 to 13 in order to prevent the circuit body 11 to 13 from being inclined in the BB' direction or displaced in the AA' direction during the step of inserting the circuit body 11 to 13 shown in FIG. 7 or the step of inserting the wedge 31 to 34. The simple jig is adapted to be extracted from the first concave portion 21 to 23 after the wedge insertion by reducing the width of the jig in anticipation of the narrowed width of the first concave portion after the insertion of the wedge 31 to 34. The second wall 303 is made rigid enough not to be deformed before or after the wedge insertion. Therefore, it is also possible to position the circuit body in the depth direction (CC' direction) based on reference planes 303A and 303B.

The second concave portion 41 to 43 is configured such that an inclination angle θb of a first wall surface 40 on the wedge side 31 to 34 and an inclination angle of a second wall surface 30 on the wedge side 31 to 34 are less than 90°. This configuration causes the first wall 302 to be deformed toward the circuit body 11 to 13 according to the insertion amount of the wedge 31 to 34. The existence of the reference planes 303A and 303B also facilitates the positioning of the wedge 31 to 34 during the insertion or press-in thereof or the installation of a deformation prevention jig. The wedge 31 to 34 is formed from a high rigidity material, such as Fe, Al, Cu, alloys thereof and graphite. In particular, Al, Cu and the alloys thereof have such a good workability as to achieve the acute angle with high precisions. Further, the wedge may be formed with a thin film layer of a soft metal such as Sn in order to eliminate unevenness of the uppermost surface thereof and to obviate clearance from the first wall 302 when the wedge is squeezed in.

Figure 9A:
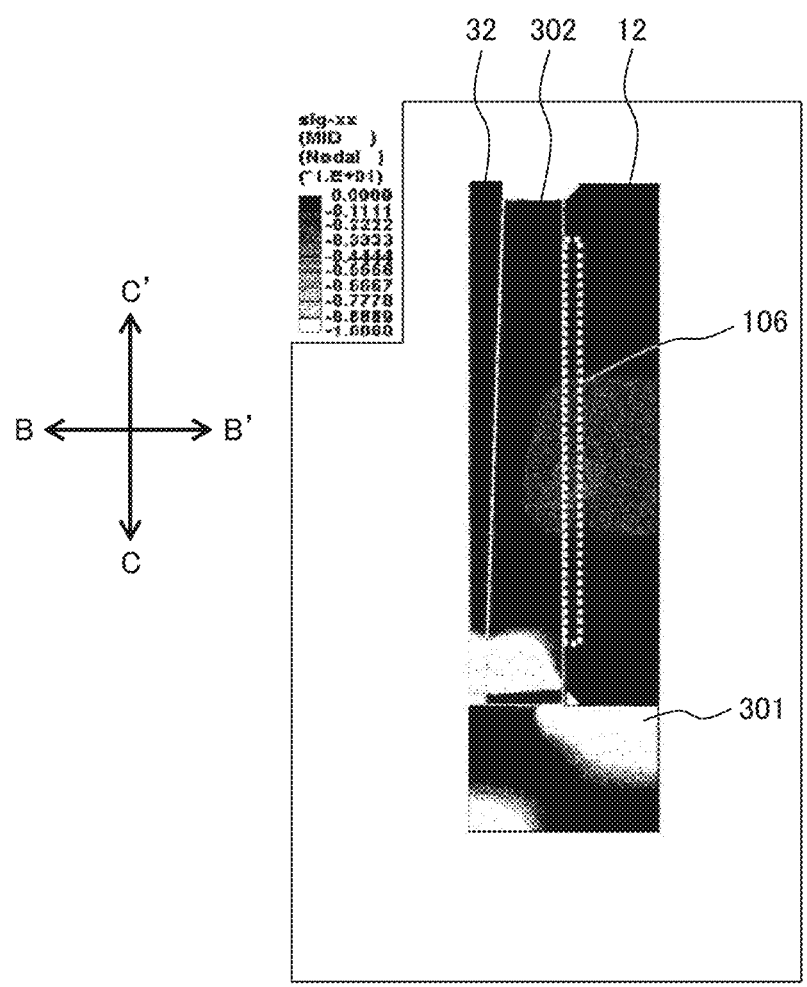
FIG. 9A is a diagram showing the result of analysis of stress applied from the wedge to the circuit body 12 via a first wall 302 when the wedge 31 to 34 is inserted in the base member 300, FIG. 9A illustrating a comparative example where an intermediate portion 304 is not provided.
Figure 9B:
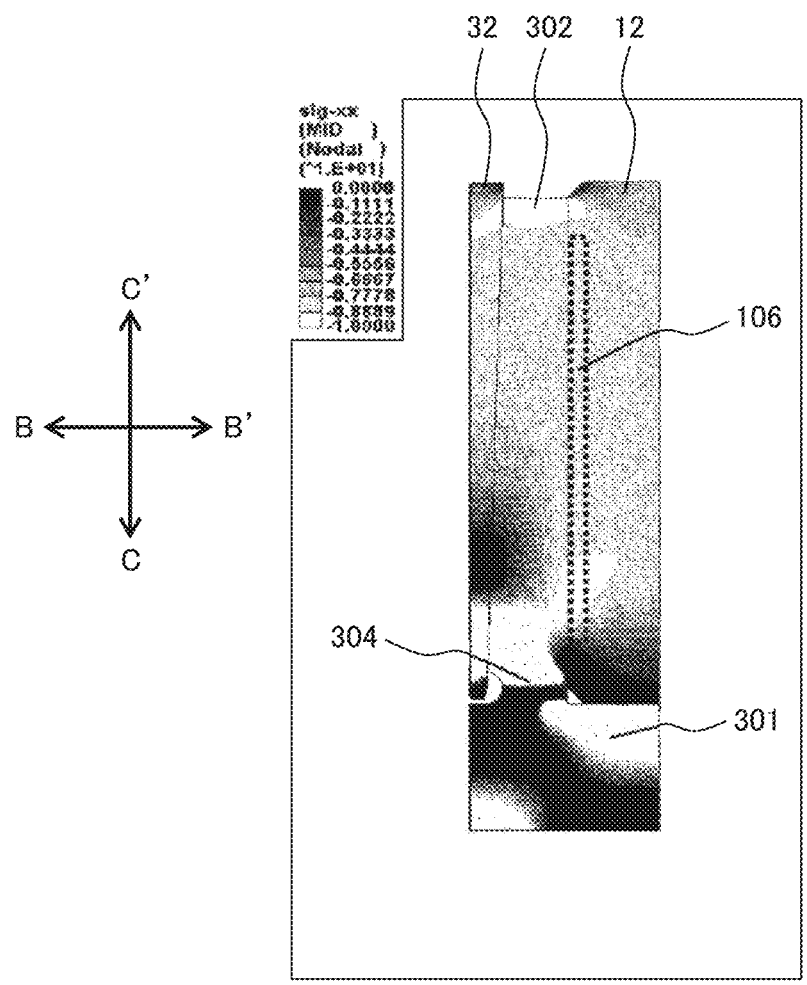
FIG. 9B is a diagram showing the result of analysis of the stress applied from the wedge to the circuit body 12 via the first wall 302 when the wedge 31 to 34 is inserted in the base member 300, FIG. 9B illustrating an embodiment of the invention where the intermediate portion 304 is provided.

FIG. 9 is a diagram showing the result of analysis of the stress applied from the wedge to the circuit body 12 via the first wall 302 when the wedge 31 to 34 is inserted in the base member 300. FIG. 9A represents a comparative example where the intermediate portion 304 is not provided, while FIG. 9B represents the embodiment where the intermediate portion 304 is provided.

A circuit body 12 expressed in light color indicates that the pressure is applied to the circuit body because of the elimination of the clearance. Comparison was made by applying the same load 2.5 MPa to squeeze in the wedge 32 in the respective examples. In the case of FIG. 9A without the intermediate portion 304, very little area of light color is seen. In the case of FIG. 9B, in contrast, it is seen that the intermediate portion 304 is formed so that the clearance between the circuit body 12 and the first wall 302 is eliminated. Hence, the compressive force is generated in the vicinity of the heat dissipating surface 106 (portion enclosed with the broken line) of the circuit body 12 and uniformized.

According to the embodiment, the pressure near the root of the first wall 302 tends to be lower than that at the other area. In contrast, the sealing resin 107 provided according to the embodiment serves as a spacer for the substrate portion 301 so that an even plane pressure is applied to the heat dissipating surface 106. It is therefore apparent that the sealing resin 107 has an effect to apply the even plane pressure to the heat dissipating surface 106.

Figure 10:
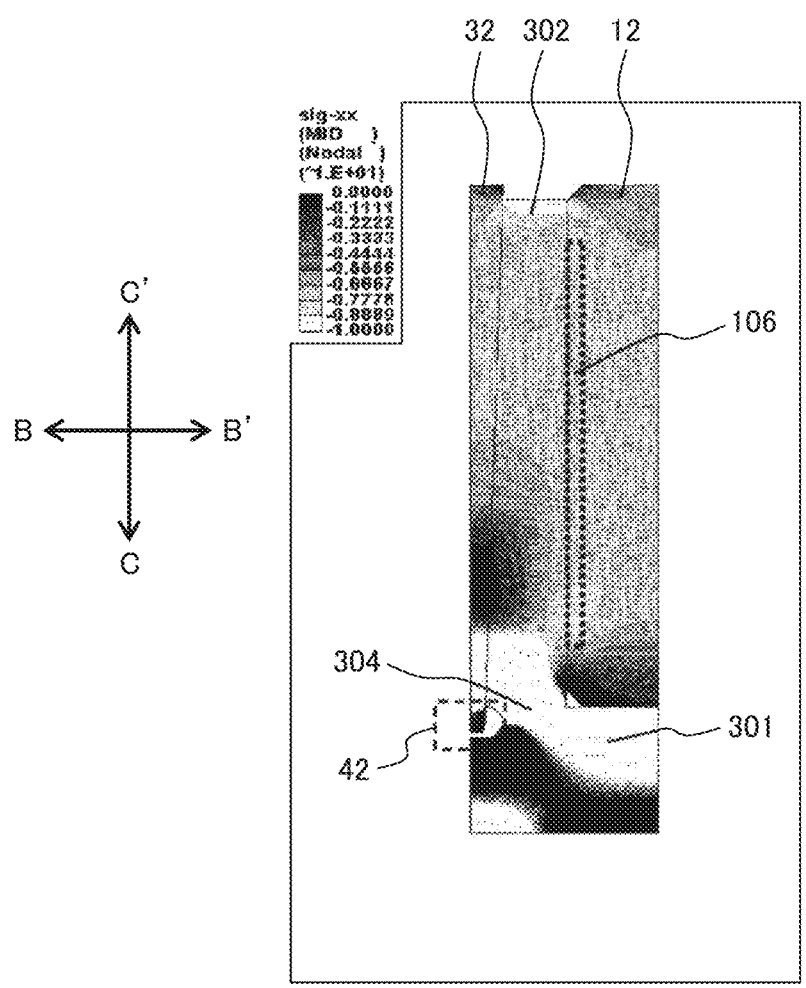
FIG. 10 shows the analysis result concerning a modification of the intermediate portion 304 provided at the base member 300.

FIG. 10 shows the analysis result concerning a modification of the intermediate portion 304 provided at the base member 300. Similarly to FIG. 9, FIG. 10 shows the result of analysis of the stress applied from the wedge to the circuit body 12 via the first wall 302 when the wedge 31 to 34 is inserted in the base member 300. In this embodiment, the second concave portion 42 is shifted toward the substrate portion 301 from the position in the configuration shown in FIG. 9B. It is apparent that the tendency of the pressure on the vicinity of the root of the first wall 302 to be lower than that of the other area is reduced.

Figure 11:
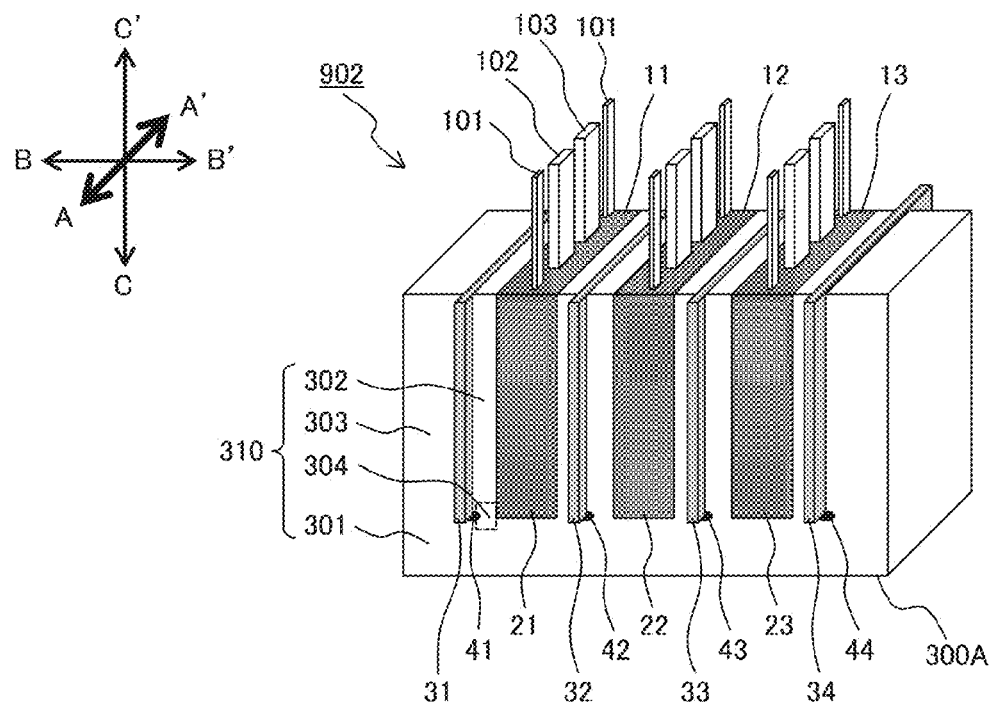
FIG. 11 is a perspective view of a power conversion apparatus 902 according to another embodiment of the invention.
Figure 12:
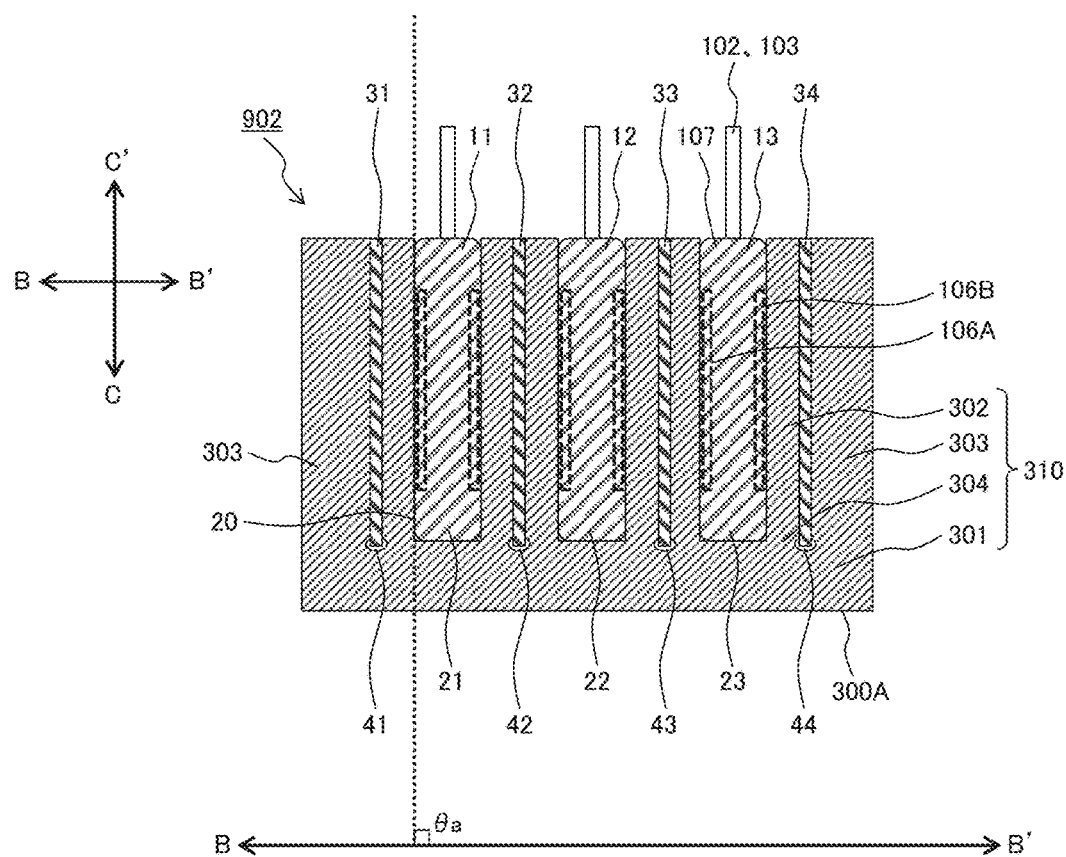
FIG. 12 is a sectional view of an AA'/BB' cross section of the apparatus of FIG. 11 as seen in the CC' direction.
Figure 13:
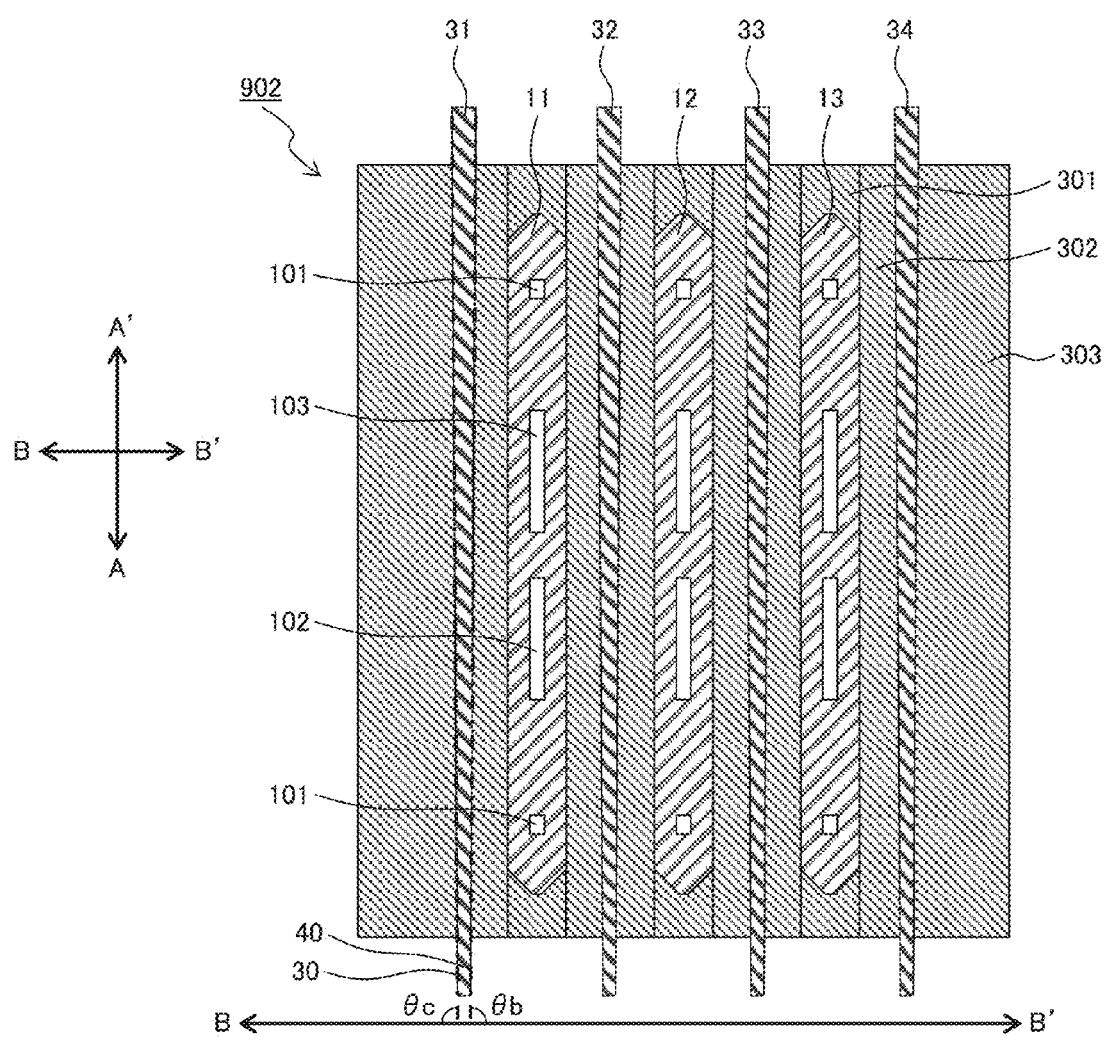
FIG. 13 is a sectional view of a BB'/CC' cross section of the apparatus of FIG. 11 as seen in the AA' direction.

FIG. 11 is a perspective view of a power conversion apparatus 902 according to another embodiment of the invention. FIG. 12 is a sectional view of an AA'/BB' cross section of the apparatus of FIG. 11 as seen in the CC' direction. FIG. 13 is a sectional view of a BB'/CC' cross section of the apparatus of FIG. 11 as seen in the AA' direction. Like reference characters refer to the corresponding components of the above-described embodiments and hence, the description thereof is dispensed with.

This embodiment differs from the embodiments shown in FIG. 1 to FIG. 9 in that the insertion direction of the wedges 31 to 34 is changed to the AA' direction.

The power conversion apparatus 902 according to this embodiment includes a plurality of circuit bodies 11 to 13 and wedges 31 to 34 are extended in the AA' direction and arranged in parallel in the BB' direction. The substrate portion 301 having the cooling surface 300A is disposed on the C side in the CC' direction, while the control terminals 101 and the power terminals 102, 103 projecting from the circuit bodies 11 to 13 are disposed on the C' side in the CC' direction.

The wedges 31 to 34 eliminate the clearance between the first walls 302 and the circuit bodies 11 to 13 and fix the circuit bodies 11 to 13 in the base member 300 by generating a compressive force parallel to the BB' direction. The compressive force on the overall heat dissipating surface 106 disposed on the circuit body 11 to 13 is generated so that the interfacial thermal resistance at the first wall 302 is reduced. The wedges are inserted in the AA' direction. As shown in FIG. 13, the wedges 31 to 34 and the second concave portions 41 to 44 extend in the wedge insertion direction (AA' direction) and have inclination angles to the BB' plane. With this configuration, the elimination of the clearance between the first wall 302 and the circuit body 11 to 13 and the increase of the plane pressure on the circuit body 11 to 13 in the compression direction can be controlled by increasing the insertion amount of the wedge.

Since the place to squeeze in the wedge 31 to 34 is separate from the circuit body 11 to 13, the circuit body 11 to 13 can be installed without causing mechanical damage to the circuit body 11 to 13. The damage to the circuit body can be avoided because the stress applied to the circuit body 11 to 13 for fixing the circuit body 11 to 13 to the base member 300 is even and besides, is small.

The plane stress can be generated by using the wedge conforming to the heat dissipating surface of the circuit body 11 to 13. Therefore, the power conversion apparatus 902 does not require a member for expanding the plane pressure and hence, can be downsized. The first wall 302 defining the heat transfer portion from the heat dissipating surface 106 of the circuit body 11 to 13 to the cooling surface 300A, and the substrate portion 301 are formed in one piece without an interface between the first wall 302 defining the heat transfer portion and the substrate portion 301 defining the heat collecting portion. Hence, the apparatus does not encounter the increase of the thermal resistance due to the existence of the interface. The apparatus is adapted to prevent the increase of the thermal resistance as compared with a case where a resin having low thermal conductivity is used for fixing the circuit body 11 to 13. Since an adhesive layer or joint layer does not exist between the heat dissipating body and the circuit body 11 to 13, the increase of the thermal resistance due to crack generation under the operating environment can be prevented.

The provision of the first concave portions 21 to 23 expedites the process of temporary insertion of the circuit bodies during manufacture. Further, the alignment process during manufacture is easy because of the accommodating portion defined by a through hole and the provision of the undeformable second wall 303. The control terminals and the like of the accommodated circuit bodies are aligned so that the subsequent connection operation is facilitated. Furthermore, the insulation distance can be ensured with high precisions so that a connection insulation part can be downsized.

In the case of a large conversion apparatus handling large currents, and in a case where a plurality of IGBTs or diode chips are mounted to the circuit body, it is preferred to increase the number of mounted elements in the AA' direction as illustrated by the embodiment. In contrast to a case where the number of mounted elements is increased in the CC' direction, the apparatus can handle the large currents without encountering the increased thermal resistance of the power semiconductor devices 103 to the cooling surface 300A. In this case, the circuit bodies 11 to 13 are increased in the width in the AA' direction. However, the apparatus can maintain the even plane pressure and the compressive force on the circuit bodies by increasing the width of the wedges 31 to 34 in the AA' direction. In the case of pressurizing with screws or springs, it is difficult to maintain the even plane pressure and the compressive force if a structure to be pressurized in a direction of required pressure is increased in length. Accordingly, the structure requires the increase of the number of pressing members such as screws and springs, or the increase of the size thereof, thus enlarging the power conversion apparatus. The pressing member part is increased in the thermal resistance, impairing the compactness and heat dissipation performance of the power conversion apparatus.

Grease or carbon sheet for elimination of unevenness may be inserted in space between the circuit body 11 to 13 and the first wall 302. Space exists between the wedge 31 to 34 and the substrate portion 301. In order to further enhance the heat dissipation performance by also utilizing the wedges 31 to 34 as the heat transfer portion, a member having higher thermal conductivity than air or resin, such as Sn round wire or In round wire elongated in the AA' direction or carbon sheet, is placed on the substrate portion 301 in a wedge accommodating portion before the wedge 31 to 34 is squeezed into the accommodating portion.

When the wedge is squeezed in the accommodating portion in this state, such a material, which is softer than the wedge and the base member, can fill in the clearance between the substrate portion 301 and the wedge 31 to 34 without deforming the wedge or the base member. Since the second concave portion is hollowed out in the AA' direction as illustrated by the embodiment, the member elongated in the AA' direction for reducing contact thermal resistance between the wedge or the circuit body and the base member is easily installed.

Figure 14:
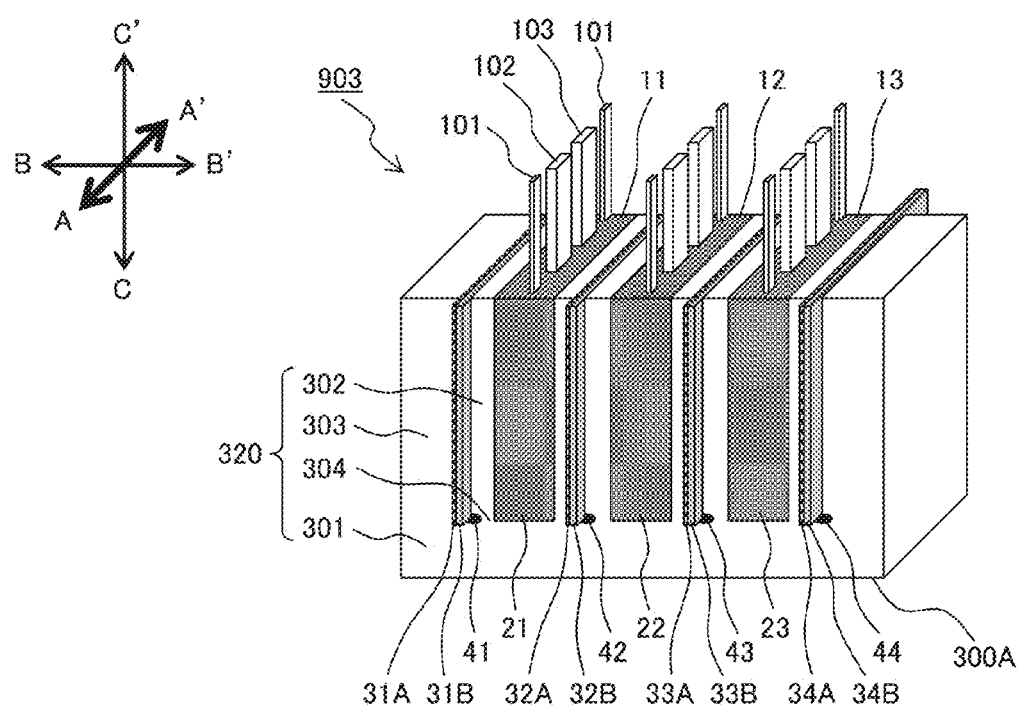
FIG. 14 is a perspective view of a power conversion apparatus 902 according to another embodiment of the invention.
Figure 15:
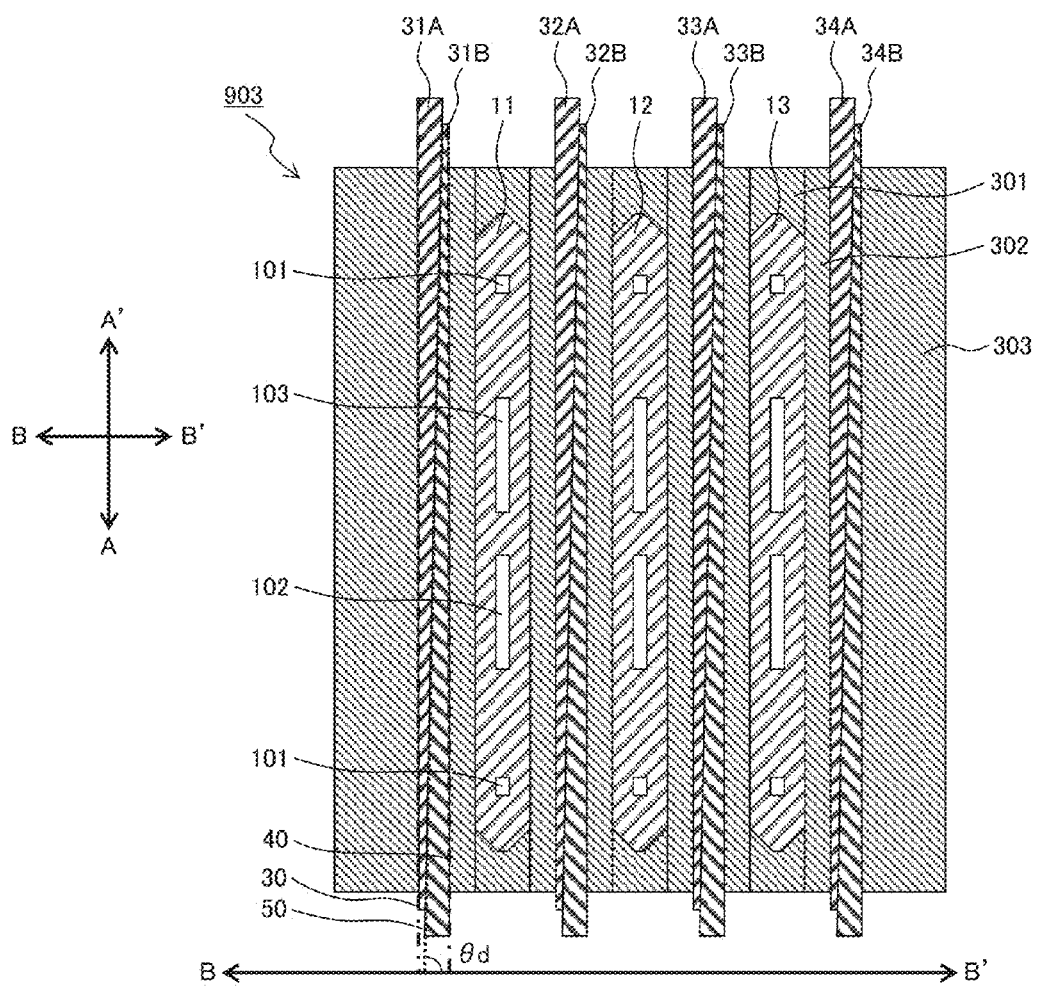
FIG. 15 is a sectional view of an AA'/BB' cross section of the apparatus of FIG. 14 as seen in the CC' direction.
Figure 16:
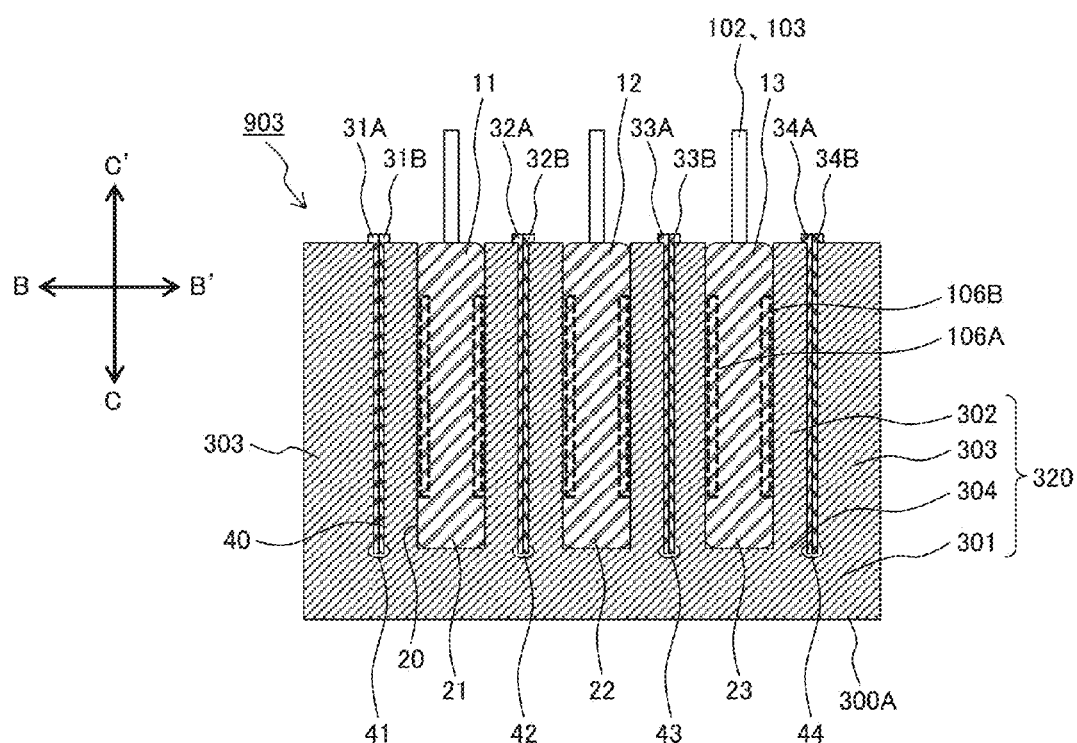
FIG. 16 is a sectional view of a BB'/CC' cross section of the apparatus of FIG. 14 as seen in the AA' direction.

FIG. 14 is a perspective view of a power conversion apparatus 902 according to another embodiment of the invention. FIG. 15 is a sectional view of an AA'/BB' cross section of the apparatus of FIG. 14 as seen in the CC' direction. FIG. 16 is a sectional view of a BB'/CC' cross section of the apparatus of FIG. 14 as seen in the AA' direction. Like reference characters refer to the corresponding components of the foregoing embodiments and hence, the description thereof is dispensed with.

The embodiment differs from the wedges 31 to 34 shown in FIG. 1 to FIG. 13 in that the wedge is divided into two parts such that the wedge itself is varied in thickness when inserted, thus coping with the change in the width of the concave portion for accommodating the wedge, preventing the impairment of plane pressure, and enhancing the productivity.

The wedge 31 is divided into a first wedge 31A and a second wedge 31B. Similarly, the wedge 32 is divided into a first wedge 32A and a second wedge 32B, while the wedge 33 is divided into a first wedge 33A and a second wedge 33B.

As shown in FIG. 14 and FIG. 15, even though the second concave portions 41 to 44 are varied in the width in the BB' direction during manufacture, the wedges can conform to the widths of the second concave portions 41 to 44 in the BB' direction by adjusting the positional relations between the first wedges 31A to 34A and the second wedges 31B to 34B. Thus, the wedges can enhance the evenness of the plane pressure for compressing the first wall 302 to the circuit bodies 11 to 13.

The insertion of the first wedge 31A to 34A and the second wedge 31B to 34B is in the AA' direction or in the CC' direction. In the case of wedge insertion in the AA' direction, the wedge is divided into two parts in the AA' direction. In the case of wedge insertion in the CC' direction, the wedge is divided into two parts in the CC' direction. The width adjustment can be accomplished by imparting inverted angles to the respective divided parts with respect to the dividing direction.

In particular, in a case where the divided first wedges 31A to 33A and second wedges 31B to 33B are inserted in the AA' direction, the following advantage is provided. Unlike the first embodiment, the first wall surface 40 and the second wall surface 30 of a base member 320 need not form inclination angles in the AA' direction. Hence, the base member 320 elongated in the AA' direction can be manufactured by extrusion molding or pultrusion molding, followed by cutting the base member 320 in a required length. This approach achieves a higher productivity than manufacturing piece by piece.

The first wall surface 40, the first wall surface 20, and the second wall surface 30 shown in FIG. 15 and FIG. 16 are extended in the AA' direction in which the first wedges 31A to 33A and the second wedges 31B to 33B are inserted, and form a right angle to the substrate portion 301.

As shown in FIG. 15, a contact surface 50 between the first wedge 31A to 33A and the second wedge 31B to 33B is extended in the AA' direction and has an inclination angle θd to the line BB'. Even though the second concave portions 41 to 44 are varied in the width in the BB' direction during manufacture, the wedges can conform to the widths of the second concave portions 41 to 44 in the BB' direction by adjusting the positional relations between the first wedges 31A to 33A and the second wedges 31B to 33B.

In other words, the contact surface 50 means a plane on which a first surface of the first wedge 31A that is opposed to the second wedge 31B is in contact with a second surface of the second wedge 31B that is opposed to the first wedge 31A. An inclination angle between the first surface and the heat dissipating surface 106 of the circuit body 11 or the like is in inverted relation to an inclination angle between the second surface and the heat dissipating surface 106 of the circuit body 11 or the like.

In a case where the first wedge 31A to 33A and the second wedge 31B to 33B are inserted in the second concave portion 41 to 44 in the BB' direction thereof, a release stop measure against mechanical impact and the like is easily provided by forming projections at ends of the wedges, as shown in FIG. 16.

Figure 17:
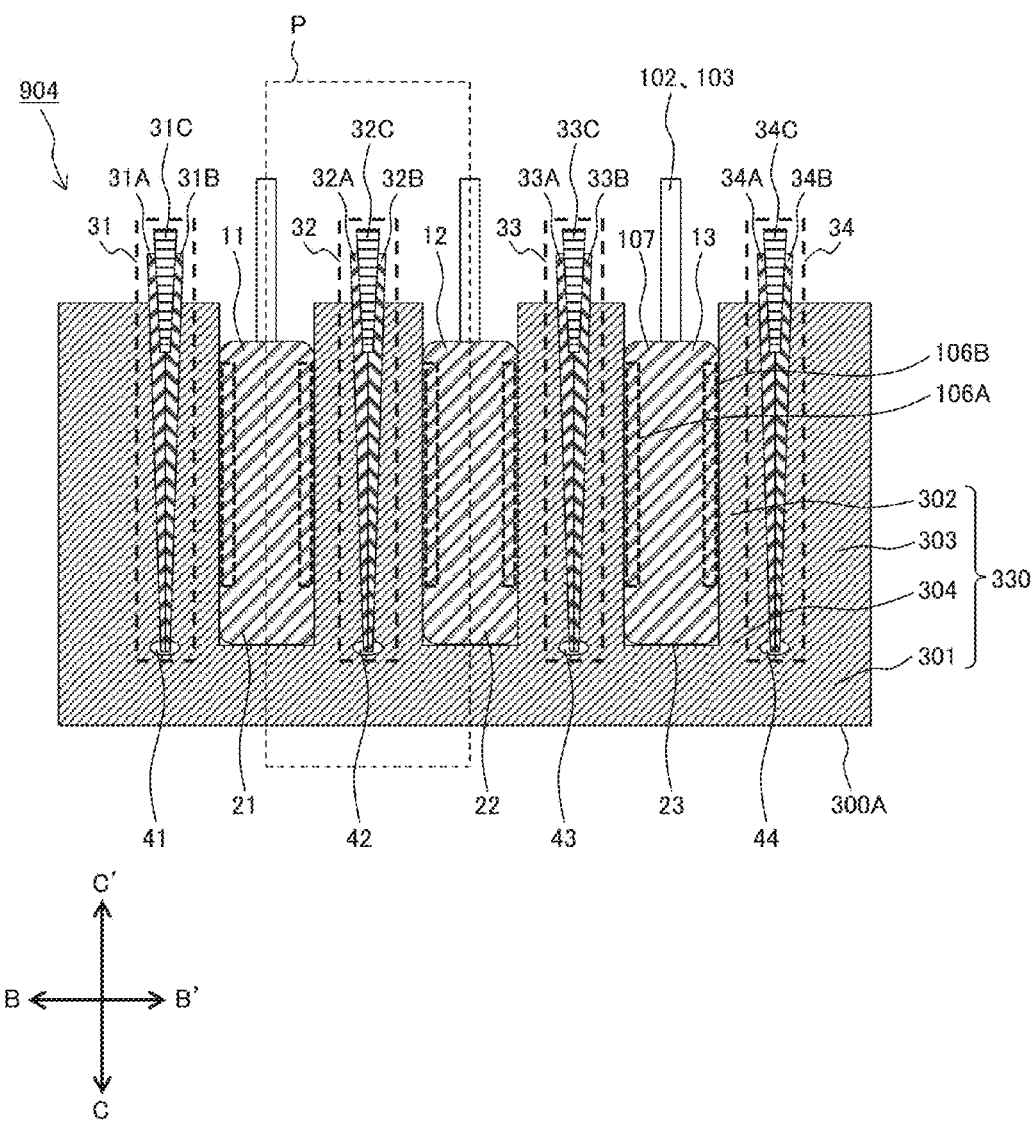
FIG. 17 is a schematic sectional view of a power conversion apparatus 904 according to another embodiment of the invention.

FIG. 17 is a schematic sectional view of a power conversion apparatus 904 according to another embodiment of the invention. Like reference characters refer to the corresponding components of the foregoing embodiments and hence, the description thereof is dispensed with. This power conversion apparatus differs from the power conversion apparatuses illustrated in FIG. 1 to FIG. 16 in that the wedge is divided into three parts such that the wedge itself has the inclination thereof conformed to the first wall 320 when inserted, thus preventing the plane pressure from being reduced in conjunction with the change in the inclination angle of the second concave portion 41 to 44, and enhancing the productivity.

The wedge 31 is configured of the first wedge 31A, the second wedge 31B having a different inclination angle from that of the first wedge 31A, and a third wedge 31C inserted between the first wedge 31A and the second wedge 31B. The wedges 32 to 34 are configured the same way.

The wedges 31 to 34 are formed in the same configuration and arranged in parallel in the AA' direction (drawing surface). As will be described hereinafter, even though the second concave portions 41 to 44 are varied in the inclination angle during manufacture, a second wall-side wedge surface and a first wall-side wedge surface can conform to the second wall and the first wall, so that the first wall 302 can achieve a higher degree of evenness of the plane pressure compressing the circuit body 11 to 13.

Figure 18A:
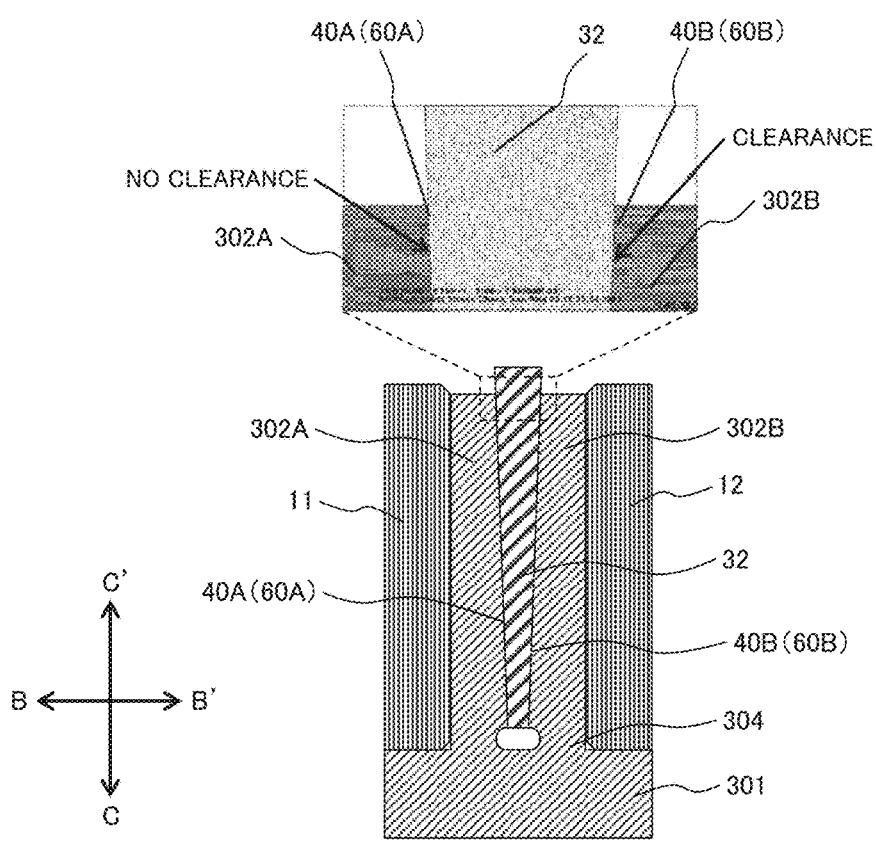
FIG. 18A illustrates a comparative example of an analysis model for showing the effect of a configuration of FIG. 17.
Figure 18B:
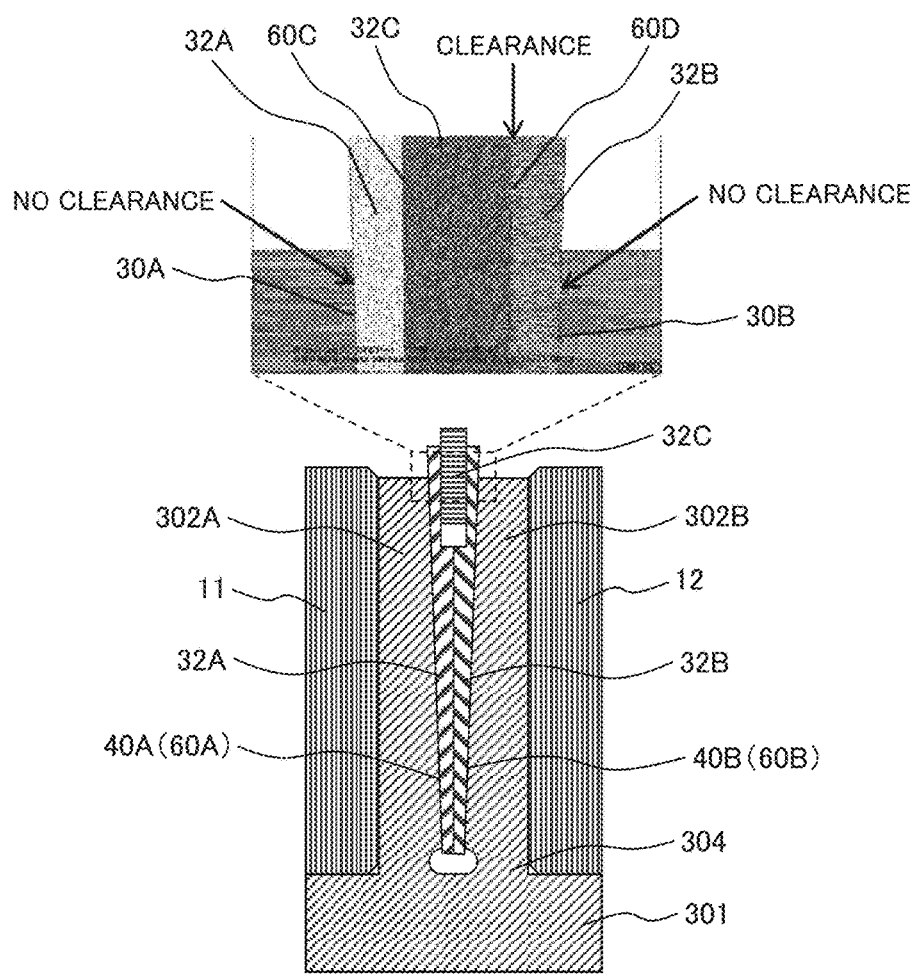
FIG. 18B illustrates an analysis model for showing the effect of a configuration of FIG. 17.

FIG. 18A represents a comparative example of an analysis model for showing the effect of a configuration of FIG. 17, while FIG. 18B represents an analysis model for showing the effect of the configuration of FIG. 17. FIG. 18A and FIG. 18B are both enlarged views of an area enclosed by the dotted line P.

As shown in FIG. 18A, the plane pressure is applied to the circuit bodies 11 and 12 via a first wall 302A on one side and a second wall 302B on the other side by squeezing the wedge 32. The first wall 302A and the second wall 302B are integrated with the substrate portion 301 via the intermediate portion 304, respectively. A reference character 40A represents a surface of the first wall 302A on the circuit body 11 side, while a reference character 60A represents a surface of the wedge 32 on the circuit body 11 side. These surfaces are inclined at the same angle so that no clearance exists between the surface 40A and the surface 60A. Meanwhile, a surface 40B is a surface of the first wall 302B on the circuit body 12 side, while a surface 60B is a surface of the wedge 32 on the circuit body 12 side. These surfaces are inclined at different angles so that a clearance exits between the surface 40B and the surface 60B. This model is configured this way.

As shown in FIG. 18B, the plane pressure is applied to the circuit bodies 11 and 12 via the first wall 302A on one side and the second wall 302B on the other side by squeezing the three divided wedges 32A to 32C. The first wall 302A and the second wall 302B are integrated with the substrate portion 301 via the intermediate portion 304, respectively. The components other than the wedge are configured the same way as in the comparative example.

The reference character 40A represents the surface of the first wall 302A on the circuit body 11 side, while the reference character 60A represents the surface of the wedge 32 on the circuit body 11 side. These surfaces are inclined at the same angle so that no clearance exists between the surface 40A and the surface 60A. Meanwhile, the surface 40B is the surface of the first wall 302B on the circuit body 12 side, while the surface 60B is the surface of the wedge 32 on the circuit body 12 side. These surfaces are inclined at different angles, but the wedge 32B is displaced (rotated) clockwise toward the first wall 302B so as to eliminate a clearance between the surface 40B and the surface 60B.

Meanwhile, the displacement (rotation) of the second wedge 32B produces a clearance between the wedge 32A and the wedge 32B. The clearance between the first wedge 32A and the second wedge 32B increases in the CC' direction according to a rotational angle of the second wedge 32B relative to the first wedge 32A. The third wedge 32C exists at an upper place in the CC' direction. The third wedge has a contact surface 30C between the first wedge 32A and the third wedge 32C, and a contact surface 30D between the first wedge 32B and the third wedge 32C. Before the second wedge 32B rotates (state without the clearance between the first wedge 32A and the second wedge 32B), the contact surface 30C and the contact surface 30D are inclined at the same angles as the third wedge 32C. Therefore, the rotation of the second wedge 32B produces a clearance between the second wedge 32B and the third wedge 32C (30D).

Figure 19:
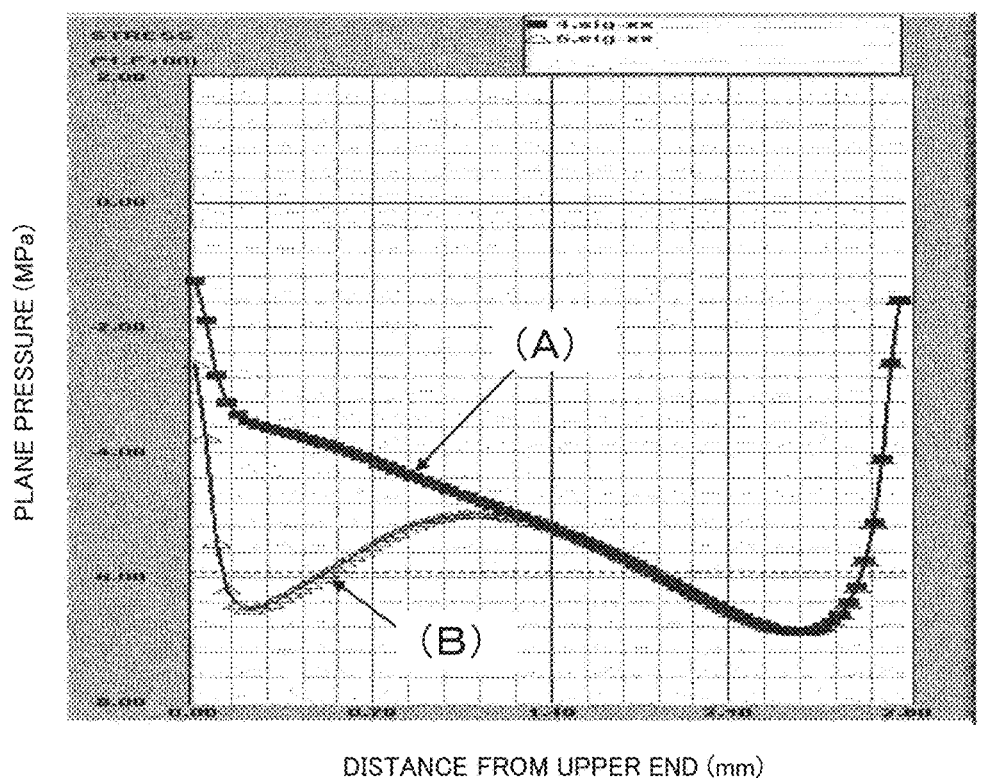
FIG. 19 shows the result of analysis of the stress applied from a first wedge 32A to a third wedge 32C shown in FIG. 18B to the circuit body 12 via the first wall 302B when the first wedge 32A to the third wedge 32C are inserted in the base member 300.

FIG. 19 graphically shows the result of analysis of the stress applied from the first wedge 32A to the third wedge 32C shown in FIG. 18B to the circuit body 12 via the first wall 302B when the first wedge 32A to the third wedge 32C are inserted into a base member 330.

In FIG. 19, the ordinate is the plane pressure on the circuit body 12 and the abscissa is the distance from an upper end of the circuit body 12. A stress to be applied to the circuit body 12 by the first wedge 32A and the rotated second wedge 32B is represented by the line A in the graph. The line A indicates that the plane pressure decreases at an upper part because the rotation of the second wedge 32B produces the clearance between the first wedge 32A and the second wedge 32B. Next, the line B in the graph represents a stress applied by squeezing the third wedge 32C, indicating that the plane pressure is uniformized.

Figure 20:
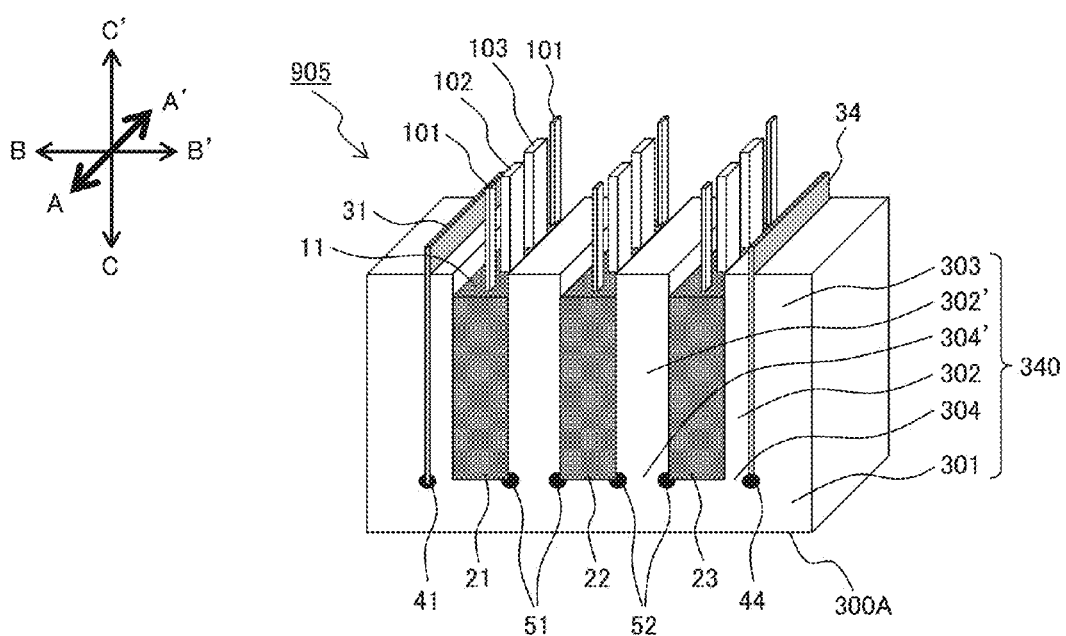
FIG. 20 is a perspective view of a power conversion apparatus 905 according to another embodiment of the invention.
Figure 21:
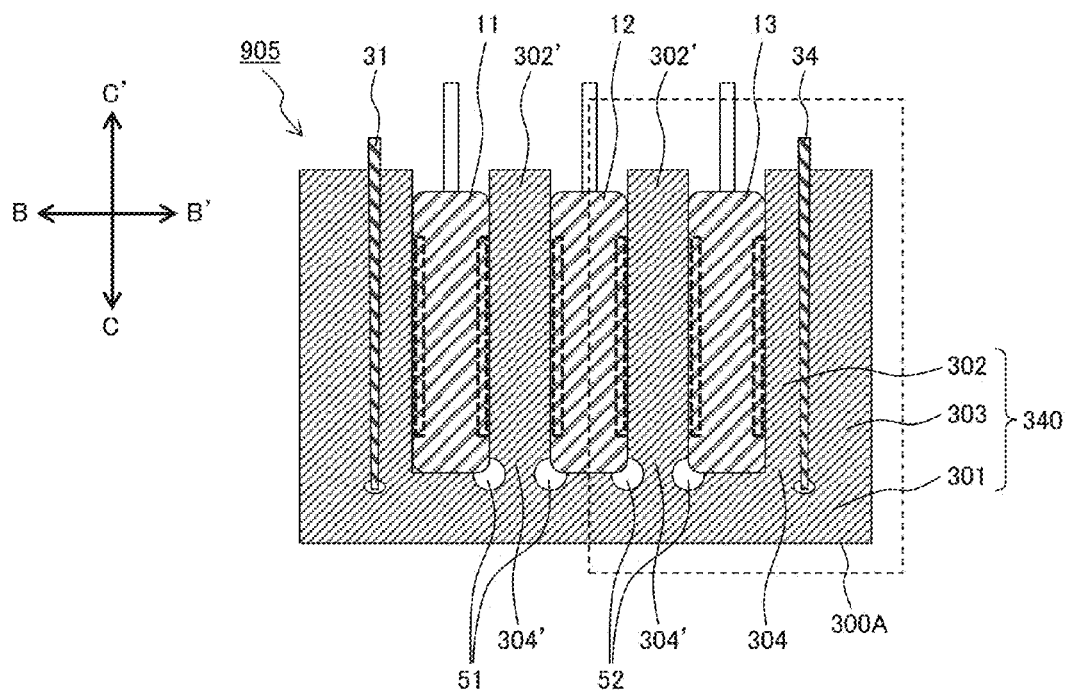
FIG. 21 is a sectional view of a BB'/CC' cross section of the apparatus of FIG. 20 as seen in the AA' direction.
Figure 22:
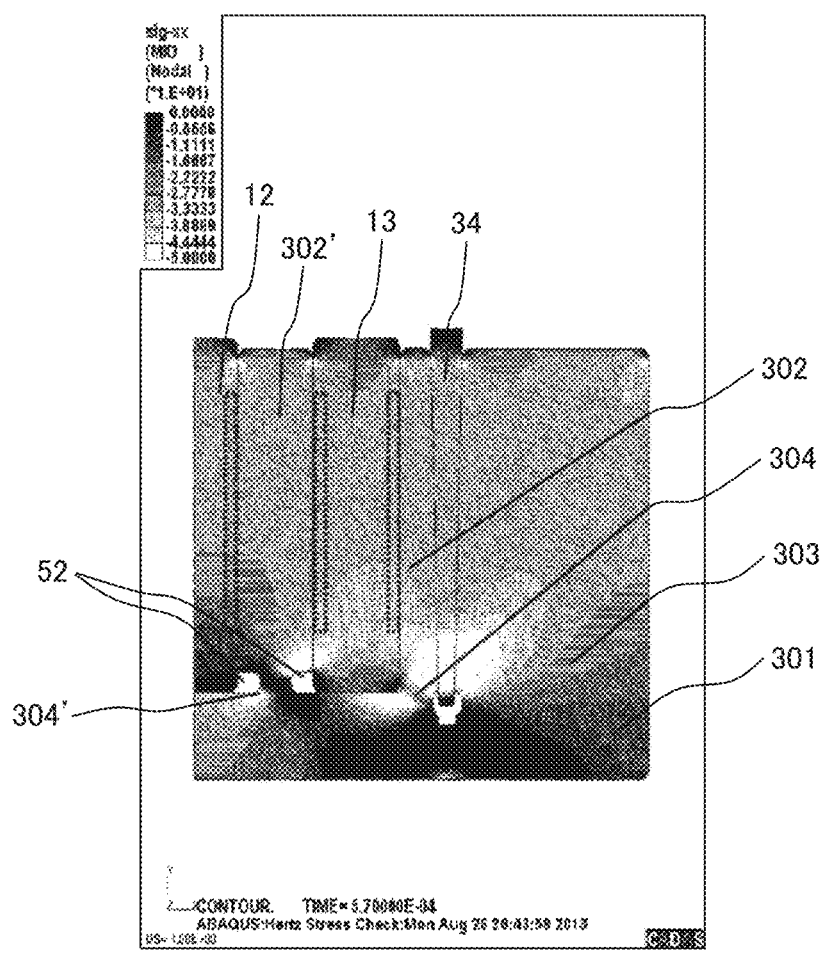
FIG. 22 shows the result of stress analysis concerning the power conversion apparatus 905 according to the above embodiment of the invention.

FIG. 20 is a perspective view of a power conversion apparatus 905 according to another embodiment of the invention. FIG. 21 is a sectional view of a BB'/CC' cross section of the apparatus of FIG. 20 as seen in the AA' direction. FIG. 22 shows the result of stress analysis concerning the power conversion apparatus 905 according to the above embodiment. An object of the embodiment is to achieve productivity enhancement and cost reduction by cutting the number of wedges.

The power conversion apparatus 905 includes: a base member 340 including the cooling surface 300A, the substrate portion 301, the first wall 302, a first wall 302', the second wall 303, the intermediate portion 304, and an intermediate portion 304'; the circuit bodies 11 to 13 and the wedges 31, 34. The circuit bodies 11 to 13 are the same as those of the foregoing embodiments. The wedges 31, 34 exist only on the second wall 303 side.

A combination of the first wall 302 and substrate portion 301, and a combination of the first wall 302' and substrate portion 301 include the intermediate portion 304, and the intermediate portion 304', respectively. The intermediate portion 304 is provided by forming a through-hole of a large diameter at each of the roots of the second concave portions 41 and 44. The intermediate portion 304' is provided by forming a through-hole 51 and a through-hole 52.

Each of the first walls 304' can be deformed and compressed toward the circuit body 12 by inserting the wedge 31 and the wedge 34.

The intermediate portion 304' is so formed as to facilitate the deformation of the first wall 302'. Specifically, the intermediate portion 304' is made more prone to deformation than the intermediate portion 304 by forming the through-holes larger than the through-holes at the respective roots of the second concave portion 41 and the second concave portion 44. At this time, the first wall 302' has no wedge inserted therein and hence, is capable of transferring heat to the substrate portion 301 without the interfacial thermal resistance with the wedge.

The base member 340 is formed by extrusion molding or pultrusion molding in the AA' direction so that the substrate portion 301 is integrated with the first walls 302 and 302', the second walls 303, the first concave portions 21 to 23, the second concave portions 41 and 44, and the through-holes 51 and 52 with high precisions.

FIG. 22 shows the result of analysis of the stress applied from the wedge 31 and the wedge 34 to the circuit bodies 12 and 13 via the first wall 302B after the insertion of the wedge 31 and the wedge 34 in the base member 340. Both the wedge 31 and the wedge 34 on the left side and the right side are inserted at a time. Light color areas in FIG. 22 indicate that the clearances between the circuit body 12 and the first wall 302', between the circuit body 13 and the first wall 302', and between the circuit body 13 and the first wall 302 are eliminated so that the compressive force is generated in the vicinity of the heat dissipating surfaces 106 (portion enclosed by the broken line) of the circuit bodies 12 and 13.

Figure 23:
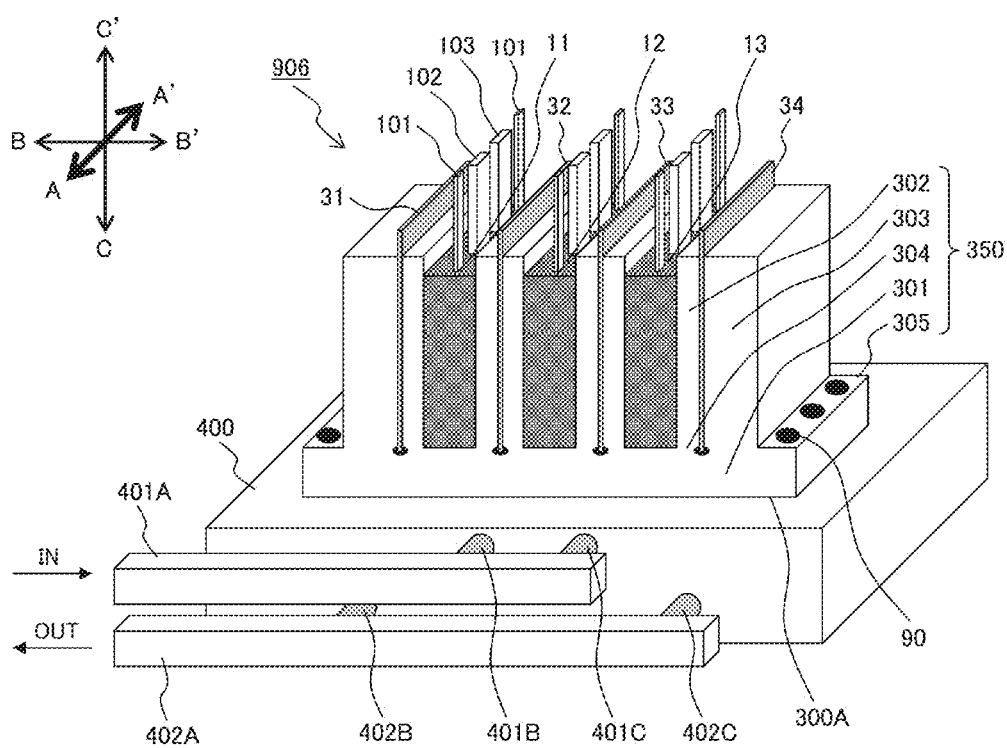
FIG. 23 is a perspective view of a power conversion apparatus 906 according to another embodiment of the invention.
Figure 24:
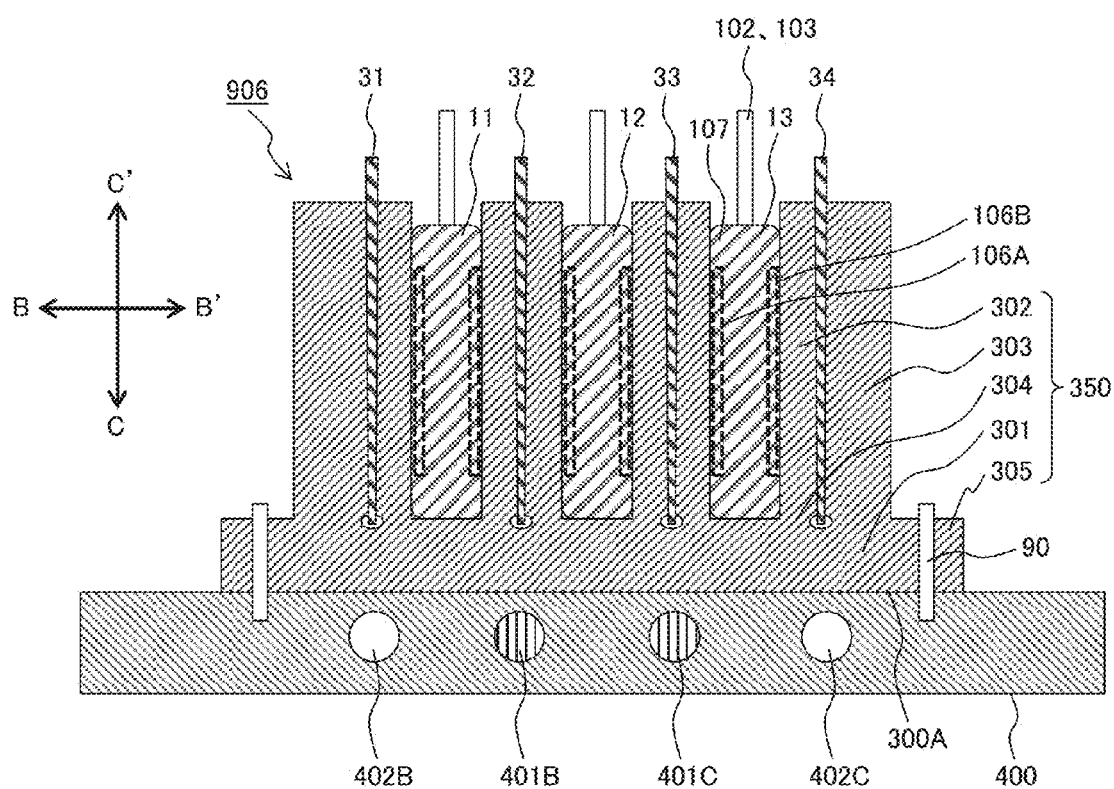
FIG. 24 is a sectional view of a BB'/CC' cross section of the apparatus of FIG. 23 as seen in the AA' direction.

FIG. 23 is a perspective view of a power conversion apparatus 906 according to another embodiment of the invention. FIG. 24 is a sectional view of a BB'/CC' cross section of the apparatus of FIG. 23 as seen in the AA' direction. An object of this embodiment is to enhance the installability of a water passage and the like of the power conversion apparatus to the cooling device, and also to enhance the cooling performance of the power conversion apparatus of the invention.

The power conversion apparatus 906 includes: a base member 350 including the cooling surface 300A, the substrate portion 301, the first wall 302, the second wall 303, and a third wall 305; a cooling channel 400; input water passages 401A to 401C; output water passages 402A to 402C; the circuit bodies 11 to 13; and the wedges 31 to 34. Like reference characters refer to the corresponding components of the foregoing embodiments and hence, the description thereof is dispensed with.

The third wall 305 is formed integrally with the substrate portion 301 by pultrusion molding or extrusion molding in the AA' direction, for example. Thus, the third wall has a plane parallel to the cooling surface 300A. Therefore, when the power conversion apparatus 906 is mounted to the cooling channel 400 via grease, carbon sheet or the like by means of screws 90, the thickness of the grease or carbon sheet is uniformized and hence, the thermal resistance can be reduced.

The cooling channel 400 includes the input water passage 401 and the output water passage 402. As shown in FIG. 23, the input water passages 401A to 401C and the output water passages 402A to 402C are adapted to increase cooling efficiency by being laid in a manner to overlap with the first walls 302 as the heat transfer portion of the circuit bodies 11 to 13 as seen in the CC' direction.

In a case where the circuit bodies 11 to 13 having the same heat value are employed, the first walls 302 in contact with the circuit body 12 are raised to the highest temperature. Therefore, the cooling efficiency can be increased even further by arranging the input water passages 401A to 401C overlapped with these first walls 302 on the input side and arranging the output water passages 402A to 402C overlapped with the other first walls 302 on the output side.

Figure 25:
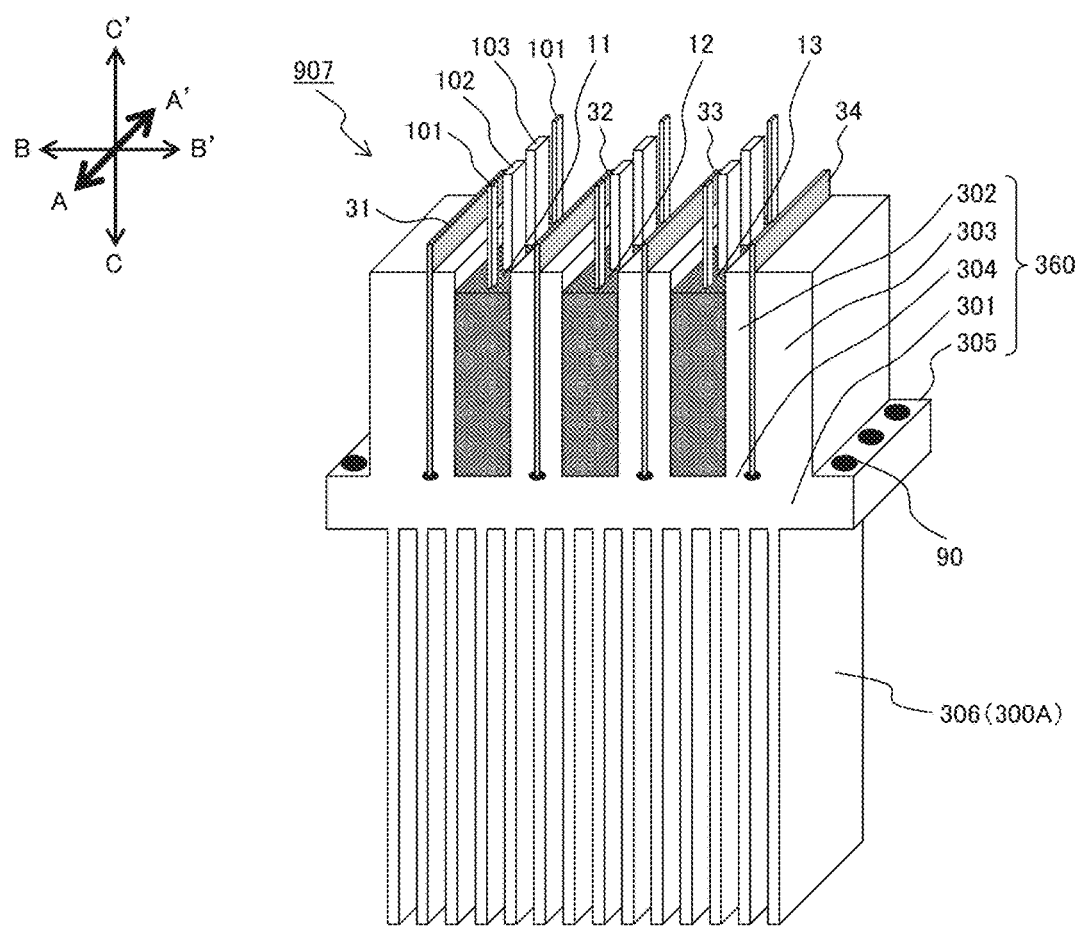
FIG. 25 is a perspective view of a power conversion apparatus 907 according to another embodiment of the invention.
Figure 26:
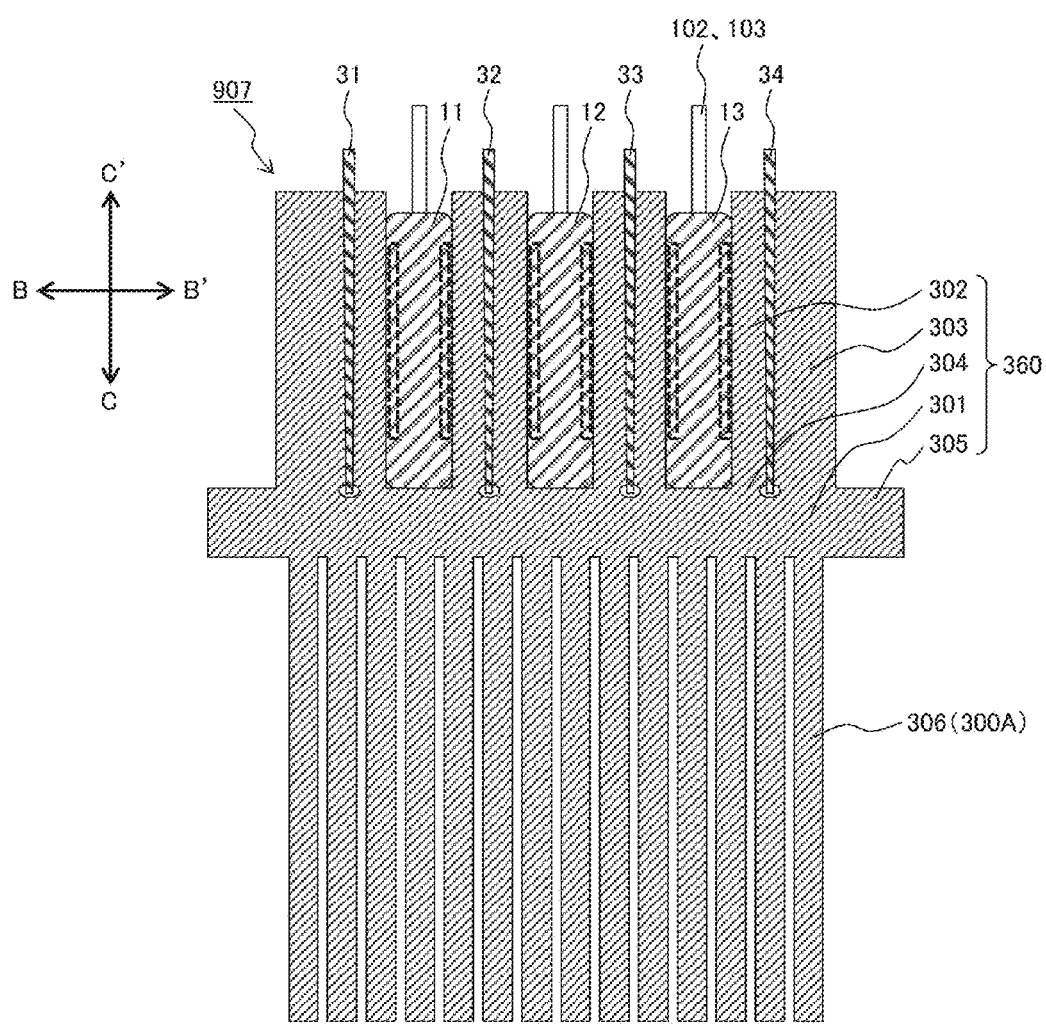
FIG. 26 is a sectional view of a BB'/CC' cross section of the apparatus of FIG. 25 as seen in the AA' direction.

FIG. 25 is a perspective view of a power conversion apparatus 907 according to another embodiment of the invention. FIG. 26 is a sectional view of a BB'/CC' cross section of the apparatus of FIG. 25 as seen in the AA' direction. This embodiment proposes a structure capable of efficient cooling when the power conversion apparatus is air-cooled. Like reference characters refer to the corresponding components of the foregoing embodiments and hence, the description thereof is dispensed with.

A base member 360 may be any of those of the foregoing embodiments. Here, the base member adopts the configuration of the power conversion apparatus illustrated in FIG. 23. The third wall 305 is formed integrally with the substrate portion 301 by pultrusion molding or extrusion molding in the AA' direction. When the third wall is mounted to a housing (not shown) of the power conversion apparatus with the screws 90, the third wall can be precisely positioned with respect to the air flow of an air-cooling fan.

This embodiment differs from the foregoing embodiments in that the cooling surface 300A is configured as an air-cooling fin 306. Similarly to the first wall 302 and the like, the air-cooling fin 306 is elongated in the AA' direction and integrated with the substrate portion 301. As compared with structures where the fin is swaged or connected with a brazing material having a lower thermal conductivity than the fin material, this structure is adapted to prevent the increase of the thermal resistance and to accomplish efficient cooling.

Figure 27:
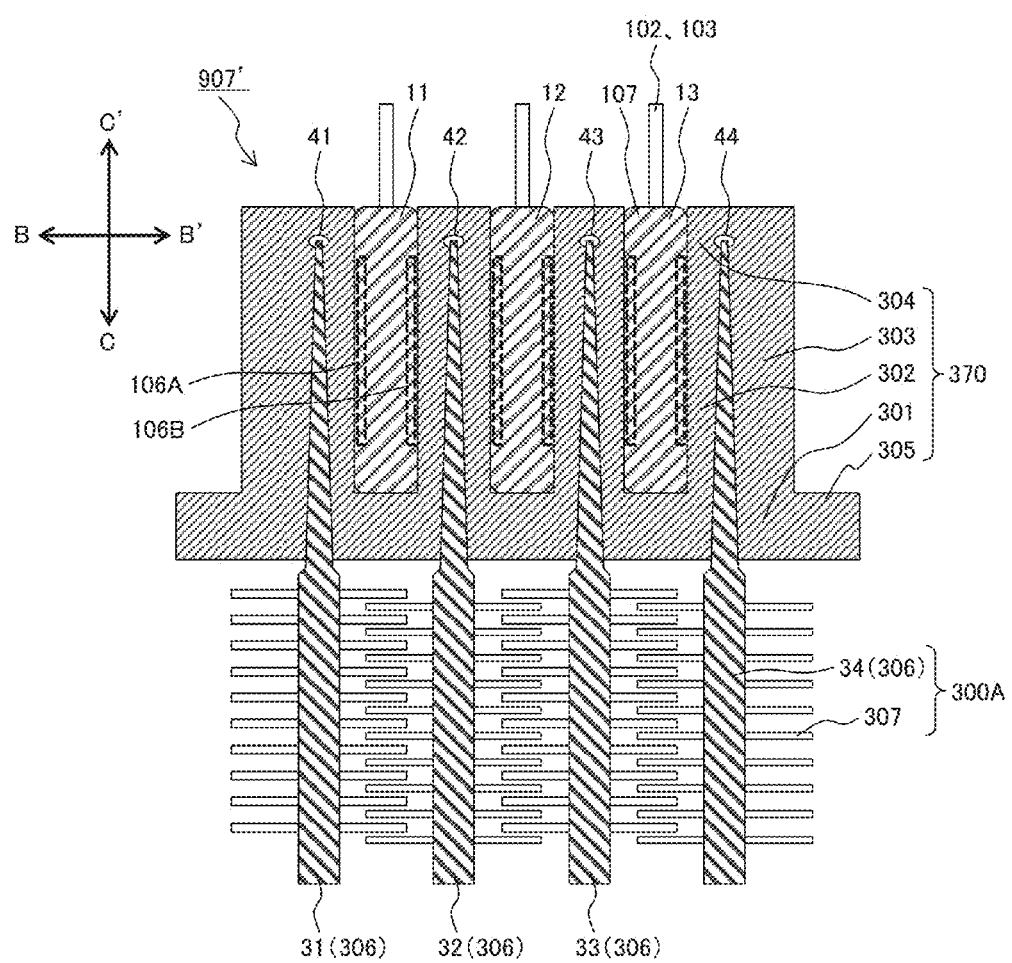
FIG. 27 is a sectional view showing a power conversion apparatus 907' according to a modification of the power conversion apparatus 907 illustrated in FIG. 25.

FIG. 27 is a sectional view showing a power conversion apparatus 907' according to a modification of the power conversion apparatus 907 illustrated in FIG. 25.

This embodiment differs from the above-described embodiment in the insertion direction of the circuit bodies 11 to 13 and the insertion direction of the wedges 31 to 34. Further, this embodiment differs from the above-described embodiment in that the wedges 31 to 34 double as the air-cooling fan 306.

The wedge 31 to 34 doubling as the air-cooling fin is widened at its portion not accommodated in a base member 370 so as not to be broken when the wedge 31 to 34 is squeezed in the base member 370. For enhancement of the thermal conductivity, another fin member 307 is attached to the wedge by brazing or swaging. The wedges 31 to 34 are squeezed in at a time. The wedges 31 to 34, which are formed with the fin members 307 mutually overlapping in the CC' direction, can be so configured as not to interfere with each other. The area of an air-cooling part 304A can be increased by forming the overlapping portions. Hence, the apparatus is increased in the thermal conductivity and capable of efficient cooling.

Figure 28:
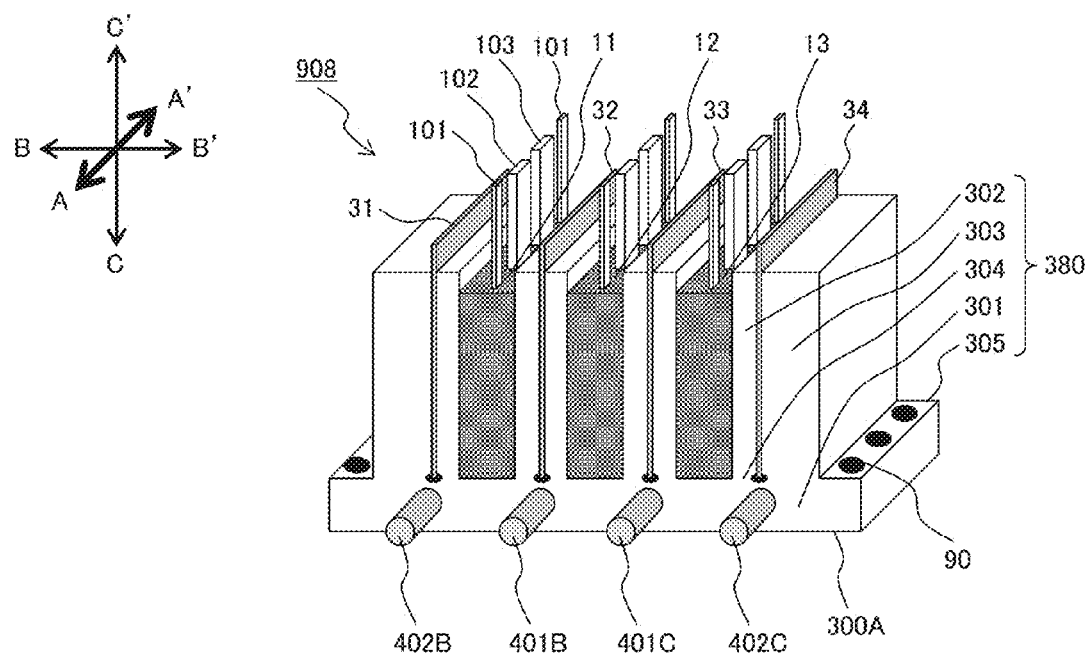
FIG. 28 is a perspective view of a power conversion apparatus 908 according to another embodiment of the invention.
Figure 29:
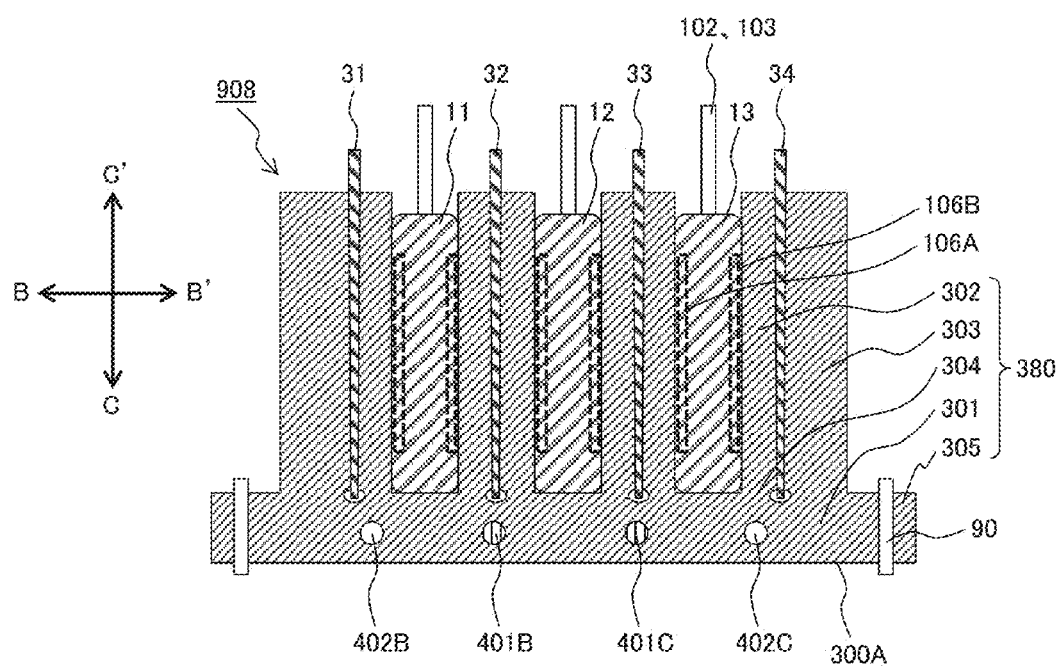
FIG. 29 is a sectional view of a BB'/CC' cross section of the apparatus of FIG. 28 as seen in the AA' direction.

FIG. 28 is a perspective view of a power conversion apparatus 908 according to another embodiment of the invention. FIG. 29 is a sectional view of a BB'/CC' cross section of the apparatus of FIG. 28 as seen in the AA' direction. This embodiment proposes a structure capable of efficient cooling when the power conversion apparatus is water-cooled. Like reference characters refer to the corresponding components of the foregoing embodiments and hence, the description thereof is dispensed with.

The power conversion apparatus 908 includes: a base member 380 including the cooling surface 300A, the substrate portion 301, the first wall 302, the second wall 303, and the third wall 305; the water passage 401B; the water passage 401C; the water passage 402B; the water passage 402C; the circuit bodies 11 to 13; and the wedges 31 to 34. While the wedges 31 to 34 may be any of those of the foregoing embodiments, this embodiment is described by way of the embodiment shown in FIG. 1.

The base member 380 may be any of those of the foregoing embodiments and includes: the first concave portion and the second concave portion, the first wall 302 defining the heat transfer portion of the circuit body, the substrate portion 301 including the cooling surface 300A, and the second wall 303 as the side wall. In order to facilitate the deformation of the first wall 302, the first wall 302 is integrated with the substrate portion 301 via the intermediate portion 304. Similarly to the embodiment shown in FIG. 23, the substrate portion includes the third wall 305.

The third wall 305 is formed integrally with the substrate portion 301 by pultrusion molding or extrusion molding in the AA' direction, for example. When the third wall 305 is mounted to the housing of a power converter with the screws 90, the third wall 305 can be precisely positioned with respect to the flow passage in the converter.

The embodiment differs in that the substrate portion 301 of the base member 380 incorporates therein insertion holes for the water passage 401B, the water passage 401C, the water passage 402B, the water passage 402C, heat pipe and the like. This eliminates the heat barrier such as the grease or carbon sheet between the cooling surface 300A and the cooling channel 400 that exist in the embodiment shown in FIG. 23. Hence, the power conversion apparatus is reduced in the thermal resistance and capable of efficient cooling.

As described in the embodiment shown in FIG. 23, the water passage 401B, the water passage 401C, the water passage 402B, the water passage 402C are adapted to further increase the cooling efficiency by receiving a cooling medium from the first wall 302 side where the heat value is increased and by outputting the cooling medium from the first wall 302 side where the heat value is decreased.

Figure 30:
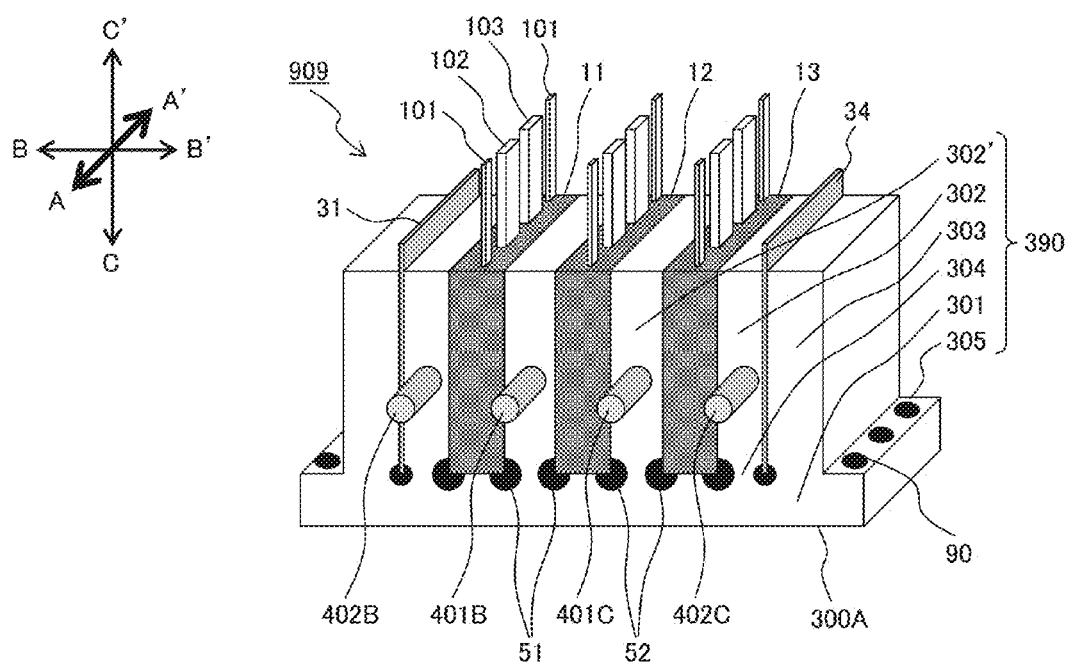
FIG. 30 is a perspective view of a power conversion apparatus 909 according to another embodiment of the invention.
Figure 31:
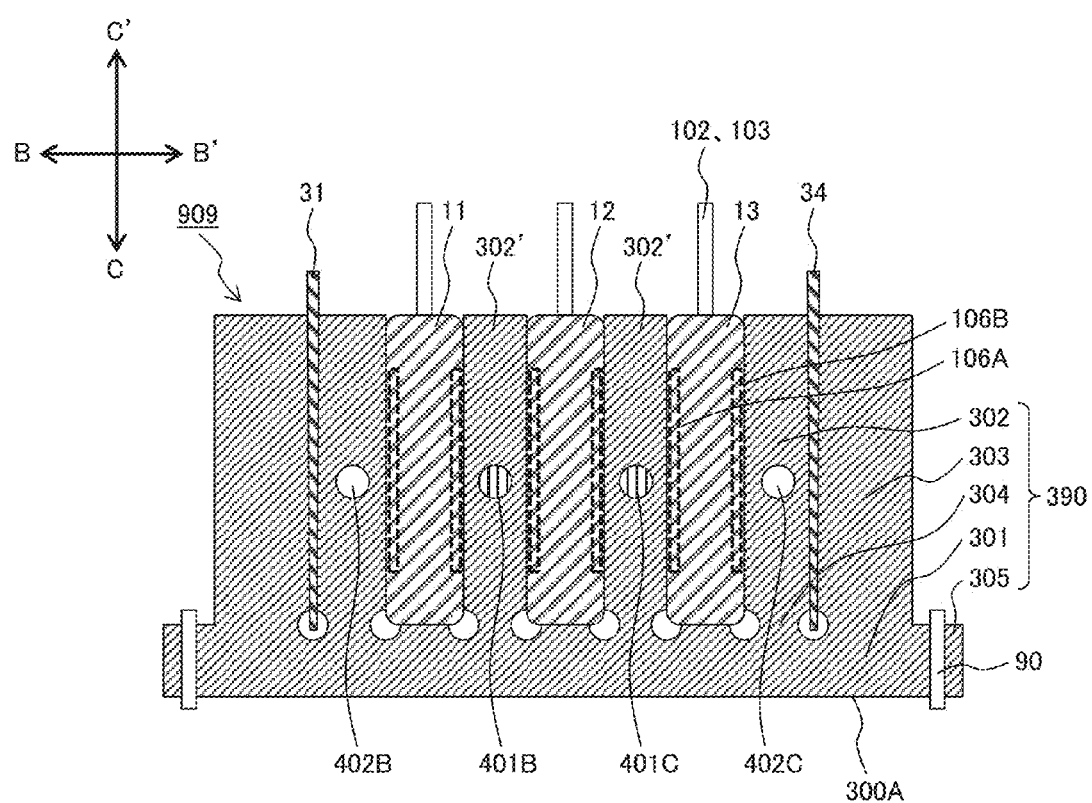
FIG. 31 is a sectional view of a BB'/CC' cross section of the apparatus of FIG. 30 as seen in the AA' direction.

FIG. 30 is a perspective view of a power conversion apparatus 909 according to another embodiment of the invention. FIG. 31 is a sectional view of a BB'/CC' cross section of the apparatus of FIG. 30 as seen in the AA' direction. This embodiment proposes a structure capable of efficient cooling when the power conversion apparatus is water-cooled. Like reference characters refer to the corresponding components of the foregoing embodiments and hence, the description thereof is dispensed with.

The power conversion apparatus 909 includes: a base member 390 including the cooling surface 300A, the substrate portion 301, the first wall 302 and the first wall 302', the second wall 303, and the third wall 305; the water passages 401 and 402; the circuit bodies 11 to 13; and the wedges 31 and 34. While the wedges 31 and 34 may be any of those of the foregoing embodiments, this embodiment is described by way of the embodiment shown in FIG. 20.

The base member 390 may be any of those of the foregoing embodiments and includes: the first concave portion and the second concave portion, the first wall 302 and the first wall 302' defining the heat transfer portion of the circuit bodies 11 to 13, the substrate portion 301 having the cooling surface 300A, and the second wall 303 as the side wall. In order to facilitate the deformation of the first wall 302, the first wall 302 and the first wall 302' integrated with the substrate portion 301 via the intermediate portion 304. Similarly to the embodiment shown in FIG. 23, this embodiment includes the third wall 305. The third wall 305 is formed integrally with the substrate portion 301 by pultrusion molding or extrusion molding in the AA' direction, for example. When the third wall 305 is mounted to the housing of the power converter with the screws 90, the third wall 305 can be precisely positioned with respect to the flow passage in the converter.

This embodiment differs in that the first wall 302 and the first wall 302' of the base member 390 incorporate therein the water passages, or the insertion holes for the water passages, heat pipe and the like. This structure permits the cooling surface 300A to be located in vicinity of the circuit bodies 11 to 13 as the heat source. Hence, the power conversion apparatus is reduced in the thermal resistance and capable of efficient cooling.

As described in the embodiment shown in FIG. 23, the water passage 401B, the water passage 401C, the water passage 402B, the water passage 402C are adapted to further increase the cooling efficiency by receiving the cooling medium from the first wall 302' side where the heat value is increased and by outputting the cooling medium from the first wall 302 side where the heat value is decreased.

Figure 32:
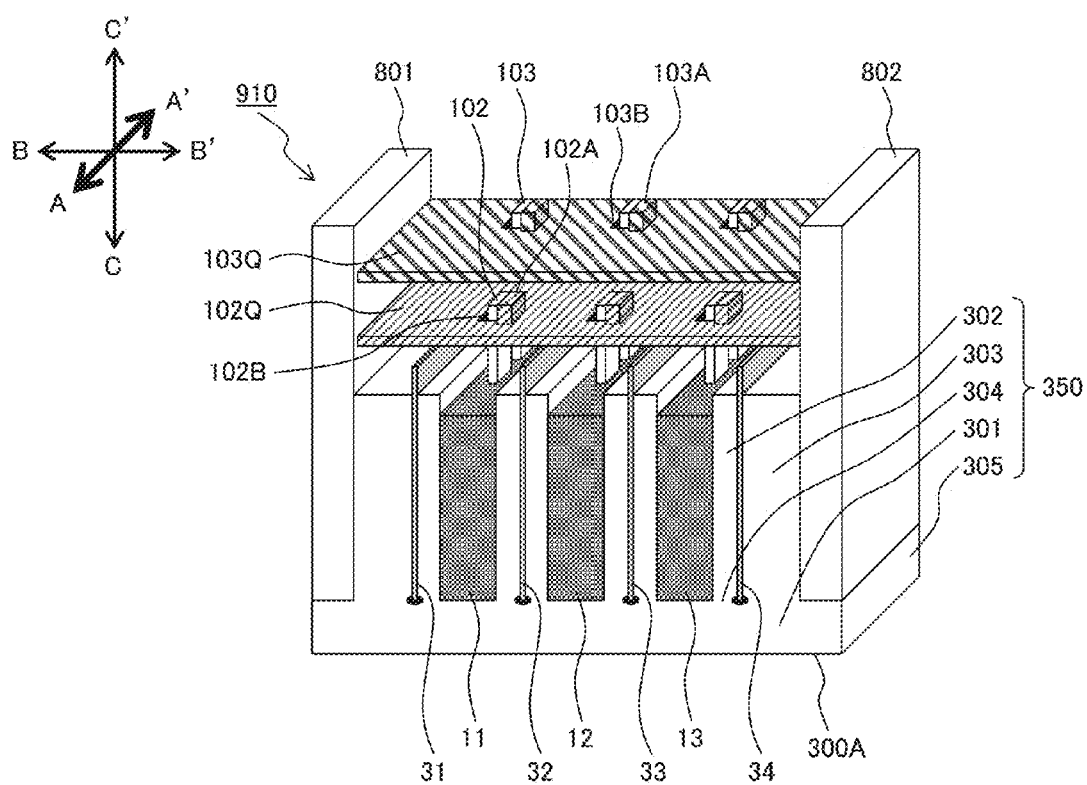
FIG. 32 is a perspective view of a power conversion apparatus 910 according to another embodiment of the invention.
Figure 33:
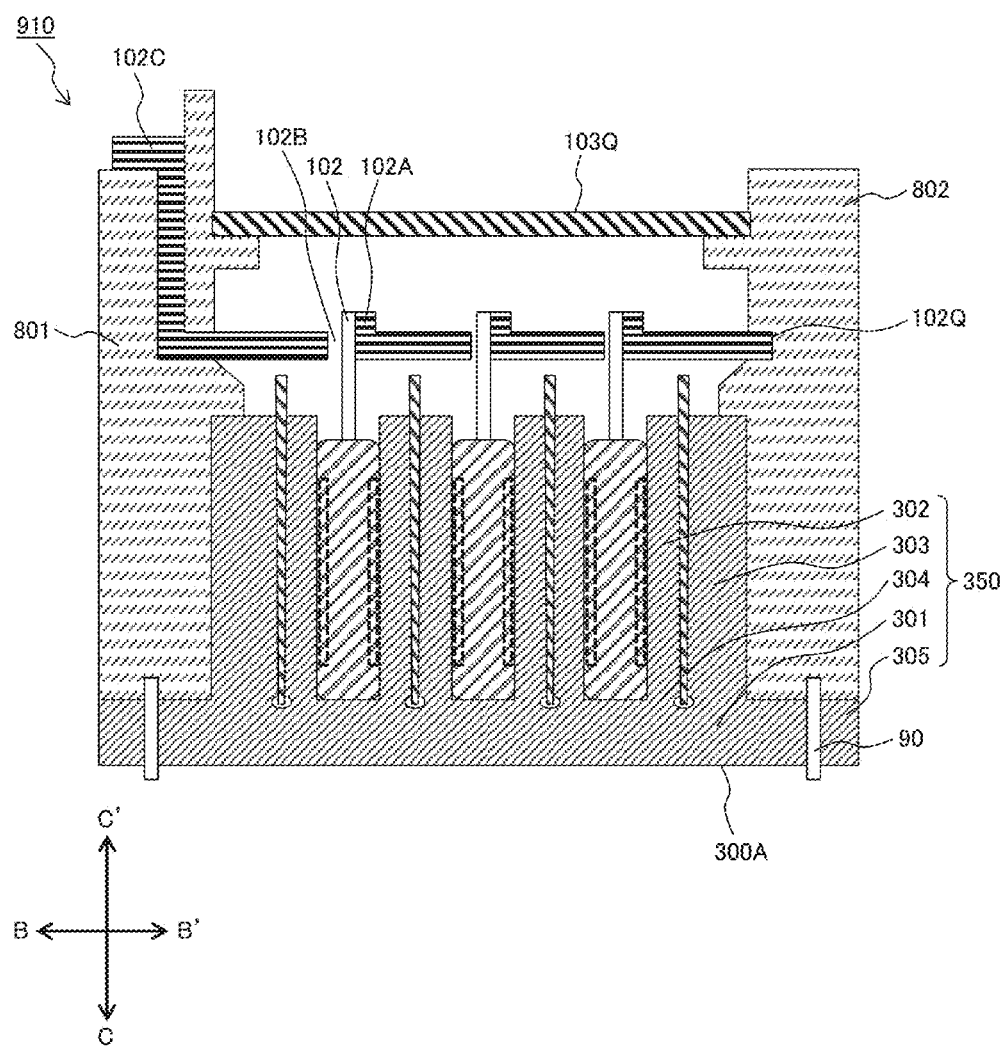
FIG. 33 is a sectional view of one BB'/CC' cross section of the apparatus of FIG. 32 as seen in the AA' direction.
Figure 34:
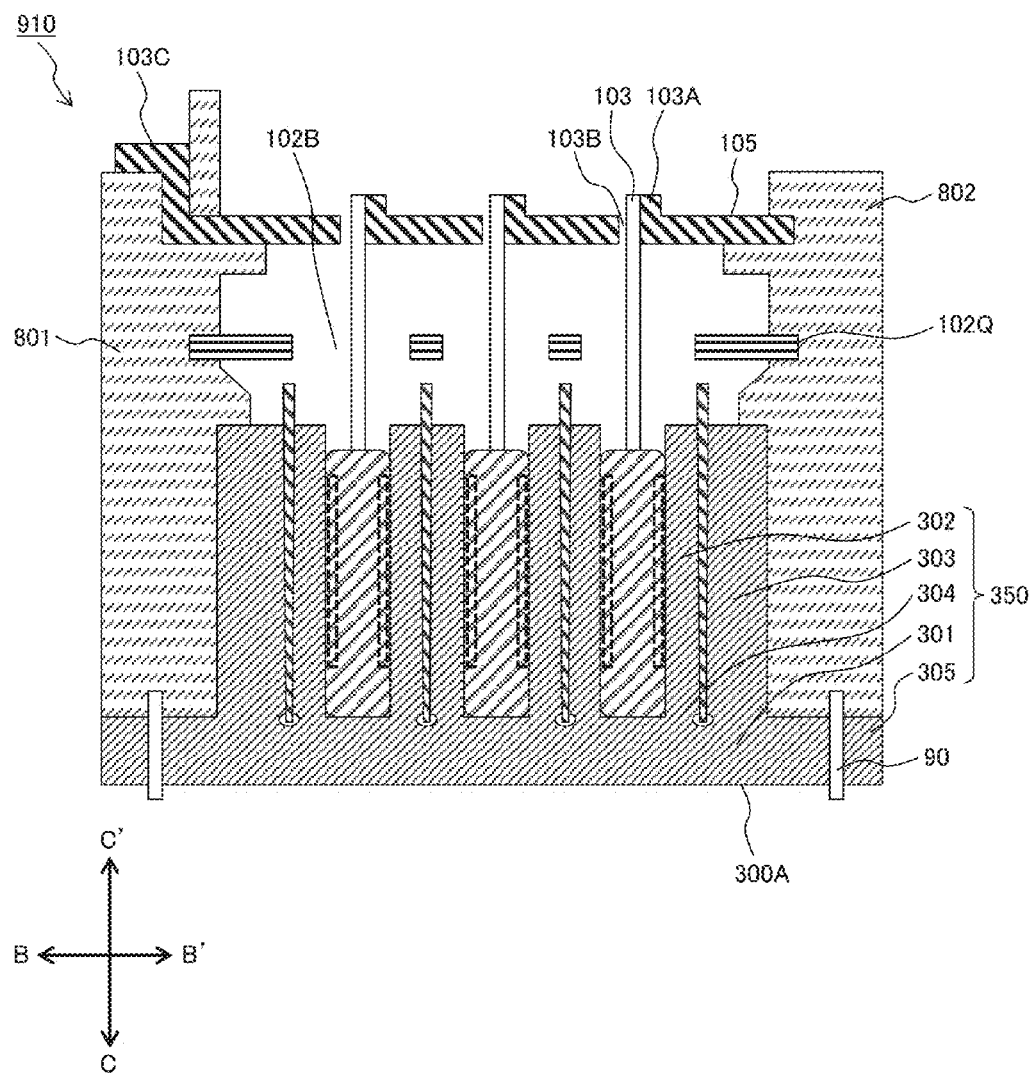
FIG. 34 is a sectional view of another BB'/CC' cross section of the apparatus of FIG. 32 as seen in the AA' direction.

FIG. 32 is a perspective view of a power conversion apparatus 910 according to another embodiment of the invention. FIG. 33 is a sectional view of one BB'/CC' cross section of the apparatus of FIG. 32 as seen in the AA' direction. FIG. 34 is a sectional view of another BB'/CC' cross section of the apparatus of FIG. 32 as seen in the AA' direction. This embodiment proposes a structure for enhancing reliability when the power conversion apparatus is connected with a coupled bus bar. Like reference characters refer to the corresponding components of the above-described embodiments and hence, the description thereof is dispensed with.

The power conversion apparatus 910 includes: the base member 350 including the cooling surface 300A, the substrate portion 301, the first wall 302, the second wall 303, the intermediate portion 304, and the third wall 305; the circuit bodies 11 to 13; the wedges 31 to 34; a coupled bus bar 102Q; a coupled bus bar 103Q; an insulating support 801; and an insulating support 802. While the base member 350 may be any of those of the foregoing embodiments, this embodiment is described by way of the embodiment shown in FIG. 23.

The coupled bus bar 102Q and the coupled bus bar 103Q are members for interconnecting the circuit bodies 11 to 13 when the circuit bodies 11 to 13 are used in parallel connection. Passing larger currents than the power terminals 102 and the power terminals 103 of the circuit bodies 11 to 13, the coupled bus bars must be decreased in the heat value by increasing the sectional area thereof. Further, the coupled bus bar 102Q and the coupled bus bar 103Q are reduced in inductance by being disposed on BB'/AA' planes externally of the circuit bodies 11 to 13 and opposed to each other. A connection portion of the coupled bus bar 102Q with the power terminal 102 is formed by bending a part of the coupled bus bar 102Q in the CC' direction into a terminal shape (bus-bar connection terminal 102A). As shown in FIG. 33, a space (bus-bar through-hole 102B) provided by bending is opened in the CC' direction, permitting the power terminal 102 of the circuit body 11 to 13 to penetrate therethrough and contributing to the increased productivity. A bus-bar connection terminal 103A and a bus-bar through-hole 103B are formed the same way. Meanwhile, as shown in FIG. 34, the coupled bus bar 102Q is also formed with a space (bus-bar through-hole 102B) for penetration by the power terminal 103 of the circuit body 11 to 13. This through-hole has a sufficient hole diameter for ensuring an insulation distance.

The insulating support 801 and the insulating support 802 function to support the coupled bus bar 102Q and the coupled bus bar 103Q such that the weight of the coupled bus bar 102Q and the coupled bus bar 103Q does not apply stress to the power terminals 102 and the power terminals 103 of the circuit bodies 11 to 13. Furthermore, the insulating supports also function to so position the coupled bus bar 102Q and the coupled bus bar 103Q as to ensure an insulation distance therebetween. Further, the insulating support 801 permits the coupled bus bars to extend therethrough to form a coupled bus-bar external terminal 102C and a coupled bus-bar external terminal 103C, while the insulating supports are formed with projections on the lateral sides thereof so as to play a role of ensuring the insulation distance. Meanwhile, the coupled bus bar 102Q and coupled bus bar 103Q are mounted to the second wall 303 and the third wall 305 serving as the reference planes of the base member 350 through the insulting supports 801 and 802, thus providing for the high precision alignment between the power terminals 102 and power terminals 103 of the circuit bodies 11 to 13 and the bus-bar connection terminals 102A and bus-bar connection terminal 103A when these terminals are connected together. This results in the reduction of spatial volume of the bus-bar part, contributing the downsizing of the power conversion apparatus.

Figure 35:
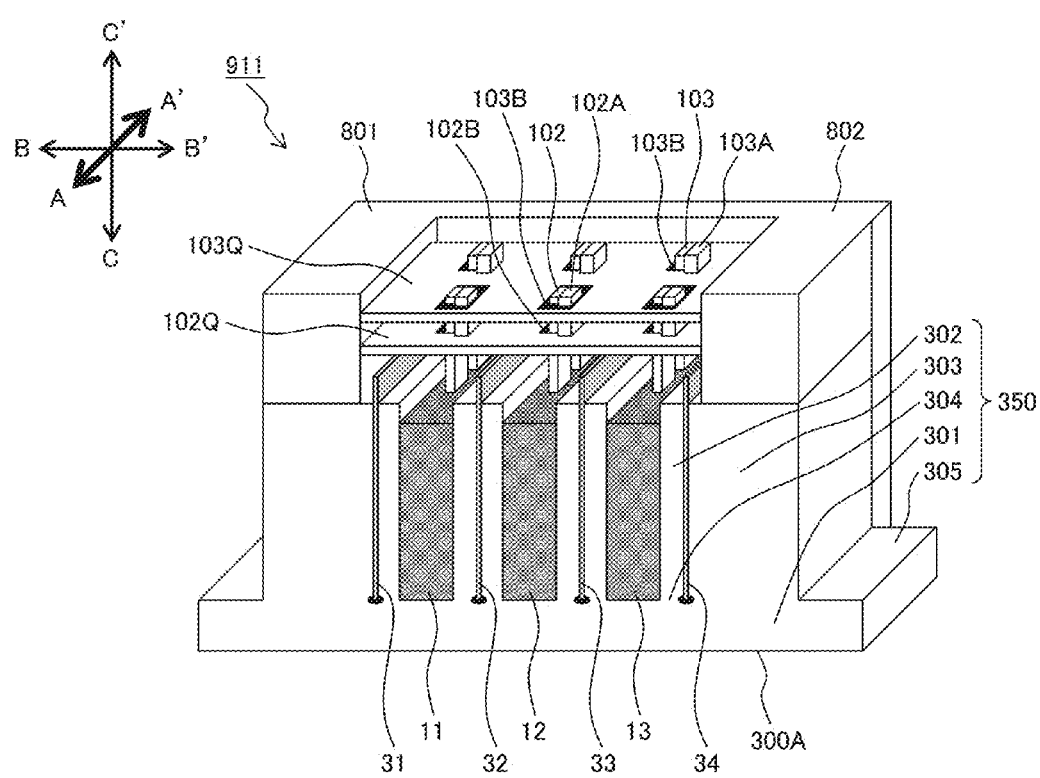
FIG. 35 is a perspective view of a power conversion apparatus 911 according to another embodiment of the invention.
Figure 36:
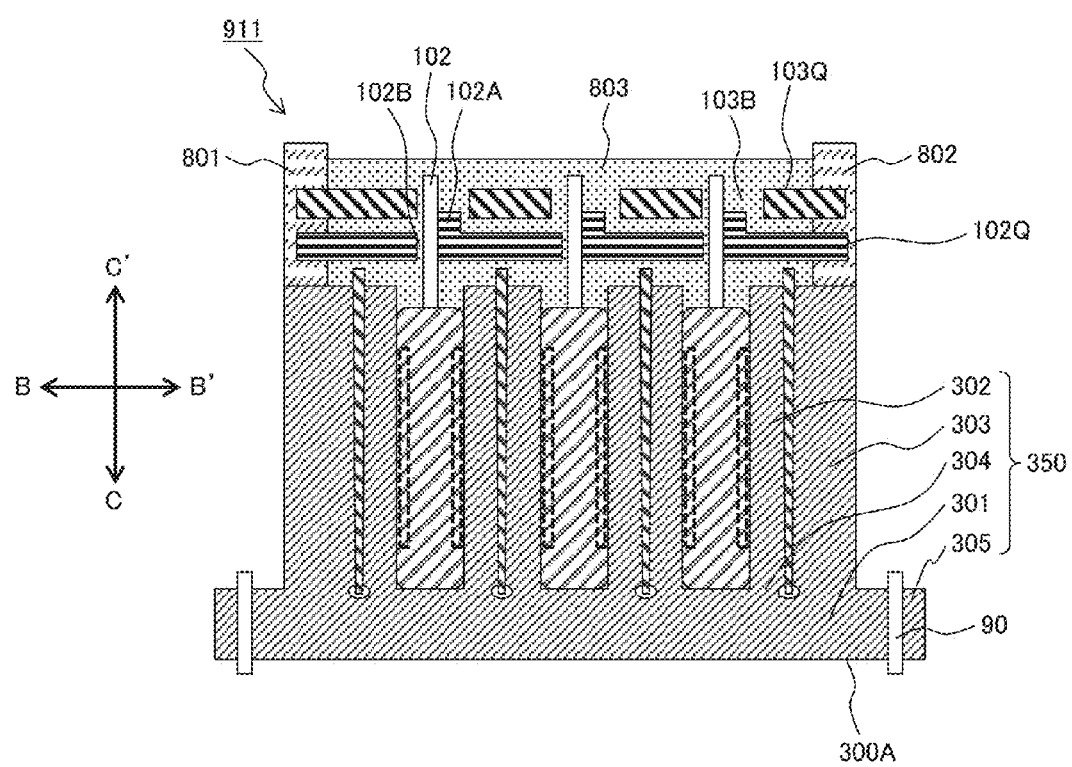
FIG. 36 is a sectional view of one BB'/CC' cross section of the apparatus of FIG. 35 as seen in the AA' direction.
Figure 37:
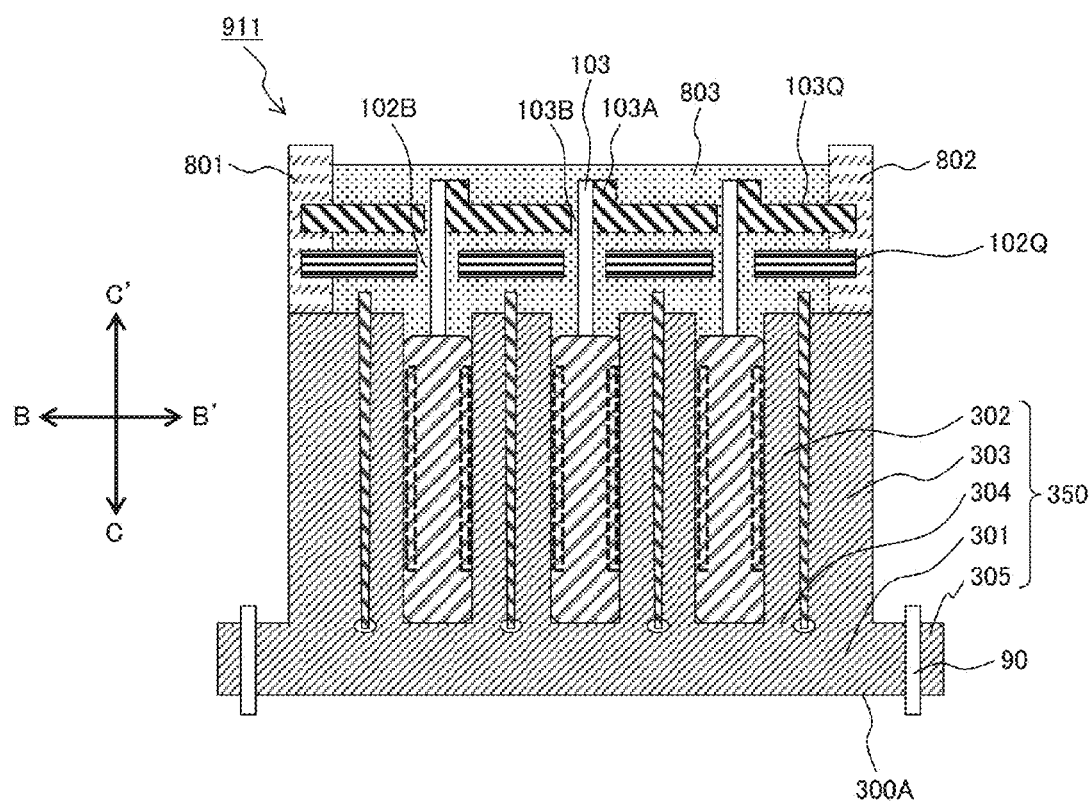
FIG. 37 is a sectional view of another BB'/CC' cross section of the apparatus of FIG. 35 as seen in the AA' direction.

FIG. 35 is a perspective view of a power conversion apparatus 911 according to another embodiment of the invention. FIG. 36 is a sectional view of one BB'/CC' cross section of the apparatus of FIG. 35 as seen in the AA' direction. FIG. 37 is a sectional view of another BB'/CC' cross section of the apparatus of FIG. 35 as seen in the AA' direction. This embodiment proposes a structure capable of achieving inductance reduction and downsizing when the power conversion apparatus is connected with the coupled bus bars. Like reference characters refer to the corresponding components of the forgoing embodiments and hence, the description thereof is dispensed with.

The power conversion apparatus 911 includes: the base member 350 including the cooling surface 300A, the substrate portion 301, the first wall 302, the second wall 303, the intermediate portion 304, and the third wall 305; the circuit bodies 11 to 13; the wedges 31 to 34; the coupled bus bar 102Q; the coupled bus bar 103Q; the insulating support 801; the insulating support 802; and a sealing gel 803.

While the base member 350 may be any of those of the foregoing embodiments, this embodiment is described by way of the embodiment shown in FIG. 23. The base member 350 includes: the first concave portion and second concave portion, the first wall 302 defining the heat transfer portion of the circuit body 11 to 13, the substrate portion 301 including the cooling surface 300A, and the second wall 303 as the side wall. In order to facilitate the deformation of the first wall 302, the first wall 302 is integrated with the substrate portion 301 via the intermediate portion 304. The third wall 305 is formed integrally with the substrate portion 301 by pultrusion molding or extrusion molding in the AA' direction, for example. When the third wall is mounted to the housing of the power converter with the screws 90, the third wall can be precisely positioned with respect to the flow passage in the converter.

The insulating support 801 and the insulating support 802 function to support the coupled bus bar 102Q and the coupled bus bar 103Q such that the weight of the coupled bus bar 102Q and the coupled bus bar 103Q does not apply stress to the power terminals 102 and the power terminals 103 of the circuit bodies 11 to 13. Furthermore, the insulating supports also function to so position the coupled bus bar 102Q and the coupled bus bar 103Q as to ensure the insulation distance therebetween. Further, the insulating support 801 permits the coupled bus bars to extend therethrough to form the coupled bus-bar external terminal 102C and the coupled bus-bar external terminal 103C, while the insulating supports are formed with projections on the lateral sides thereof so as to play a role of ensuring the insulation distance. Meanwhile, as mounted to the second wall 303 and the third wall 305 serving as the reference planes of the base member 350, the insulating supports provide for the high precision alignment between the terminals 102 and 103 of the circuit bodies 11 to 13 and the coupled bus-bar connection terminals 102A and 103A when these terminals are connected together. This results in the reduction of spatial volume of the bus-bar part, contributing the downsizing of the power conversion apparatus.

The embodiment accomplishes the reduction of the insulation distance between the coupled bus bar 102Q and the coupled bus bar 103Q by sealing a region with the insulation sealing material 803 such as a silicone gel, the region including the power terminals 102 and power terminals 103 of the circuit bodies, the coupled bus bar 102Q and coupled bus bar 103Q, and the connection portions thereof. In order to be sealed with the silicone gel, the insulating support 801 and insulating support 802 are configured to enclose the base member 350 to prevent gel leakage. This configuration permits further downsizing of the power conversion apparatus.

REFERENCE SIGNS LIST

11: circuit body,
12: circuit body,
13: circuit body,
21: first concave portion,
22: first concave portion,
23: first concave portion,
31: wedge,
32: wedge,
33: wedge,
34: wedge,
41: second concave portion,
42: second concave portion,
43: second concave portion,
44: second concave portion,
101: control terminal,
102: power terminal,
103: power terminal,
300: base member,
300A: cooling surface,
301: substrate portion,
302: first wall,
303: second wall,
304: intermediate portion,
901: power conversion apparatus.

The invention claimed is:

1. A power conversion apparatus comprising:
a circuit body including a switching device;
a base member forming a first concave portion and a cooling surface, and
a wedge inserted in the first concave portion of the base member, wherein
the first concave portion of the base member is formed by: a substrate portion forming the cooling surface; a first wall disposed on the opposite side of the substrate portion from the cooling surface; and an intermediate portion interconnecting the first wall and the substrate portion,
the first wall forms an insertion space for insertion of the wedge, and a heat dissipating surface of the circuit body,
the intermediate portion is plastically deformed by inserting the wedge into the insertion space, thus causing the first wall to be displaced toward the location of the circuit body,
the intermediate portion is immediately adjacent to the insertion space and the circuit body,
the insertion space defines on a first end thereof a cylindrical concavity, and
a width of the insertion space gradually increases from a smallest width in a region of the insertion space that is immediately adjacent to the cylindrical concavity to a largest width at a second end of the insertion space that is farthest from the first end.

2. The power conversion apparatus according to claim 1, wherein
the base member has the substrate portion, the first wall and the intermediate portion integrally formed from the same material by pultrusion molding or extrusion molding, and
the intermediate portion is continuously formed from one end to the other end of the first wall in the pultrusion direction or extrusion direction.

3. The power conversion apparatus according to claim 2, wherein
the wedge is configured of a first wedge and a second wedge,
a surface of the first wedge that is opposed to the second wedge is defined as a first surface, and a surface of the second wedge that is opposed to the first wedge is defined as a second surface, and
the first wedge and the second wedge are formed in a manner that an inclination angle of the first surface to the heat dissipating surface of the circuit body is in inverted relation to an inclination angle of the second surface to the heat dissipating surface of the circuit body.

4. The power conversion apparatus according to claim 2, wherein
the wedge is configured of a first wedge, a second wedge, and a third wedge interposed between the first wedge and the second wedge, and
the first wedge and the second wedge are pressed against an inside wall forming the insertion space by inserting the third wedge.

5. The power conversion apparatus according to claim 4, wherein
the base member includes second walls opposed to the first walls with the circuit bodies interposed therebetween, and
the second wall is not formed with the insertion space for insertion of the wedge.

6. The power conversion apparatus according to claim 5, further comprising a cooling body thermally connected to the cooling surface of the substrate portion, wherein the substrate portion includes a third wall formed in parallel to the cooling surface and fixed to the cooling body.

7. The power conversion apparatus according to claim 5, wherein
an air-cooling fin is formed integrally with the substrate portion forming the cooling surface, and formed from the same material.

8. The power conversion apparatus according to claim 5, wherein
the substrate portion is formed with a flow passage for running a cooling medium.

9. The power conversion apparatus according to claim 5, wherein
the first wall is formed with a flow passage for running a cooling medium.

10. The power conversion apparatus according to claim 9, further comprising:
a bus bar for carrying current to the circuit body; and
a resin support portion supported by the base member, wherein
the bus bar is supported by the resin support portion.

11. The power conversion apparatus according to claim 10, further comprising a gel material for covering the wedge and the first wall.

* * * * *